(12) United States Patent
Lee et al.

(10) Patent No.: US 8,837,221 B2
(45) Date of Patent: Sep. 16, 2014

(54) WRITE BIAS CONDITION FOR 2T-STRING NOR FLASH CELL

(75) Inventors: Peter Wung Lee, Saratoga, CA (US); Fu-Chang Hsu, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 394 days.

(21) Appl. No.: 13/199,527

(22) Filed: Sep. 1, 2011

(65) Prior Publication Data

US 2012/0087190 A1 Apr. 12, 2012

Related U.S. Application Data

(60) Provisional application No. 61/402,782, filed on Sep. 3, 2010.

(51) Int. Cl.
G11C 11/34 (2006.01)
G11C 16/04 (2006.01)
G11C 16/34 (2006.01)
G11C 16/14 (2006.01)

(52) U.S. Cl.
CPC ........ G11C 16/0416 (2013.01); G11C 16/3436 (2013.01); G11C 16/14 (2013.01)
USPC ............ 365/185.17; 365/185.01; 365/185.13; 365/185.26

(58) Field of Classification Search
CPC ...................................................... G11C 5/063

USPC ............... 365/185.17, 63, 185.05, 185.29, 365/185.24, 185.22, 185.26
See application file for complete search history.

(56) References Cited

U.S. PATENT DOCUMENTS

| 2004/0190343 A1* | 9/2004 | Park et al. ................. 365/185.28 |
| 2005/0226048 A1* | 10/2005 | Lee ........................... 365/185.17 |
| 2007/0104002 A1* | 5/2007 | Edahiro ........................ 365/203 |
| 2009/0175083 A1* | 7/2009 | Ajika et al. ............... 365/185.13 |

* cited by examiner

Primary Examiner — Son Dinh
Assistant Examiner — Uyen B Tran
(74) Attorney, Agent, or Firm — Saile Ackerman LLC; Stephen B. Ackerman

(57) ABSTRACT

This invention discloses circuit and methods of a NAND-based 2T-string NOR flash cell structure as a building block for a fast random-read NOR flash memory. The key concept of this new set of bias conditions in cell array improves over the critical concern of punch-through issue when cell is migrating to the more advanced technology node of next generation. The invention adopts a novel preferable symmetrical 2T-string NOR flash cell. Each NAND or NAND like cell of this 2T-string NOR cell is to store 2 bits and is preferable to be made of N-channel device. The cell is preferable to use Fowler-Nordheim Tunneling scheme for both erase and program operations. The invention is to provide a novel 2T-string NOR flash cell structure made of N-channel device offering most flexible erase sizes in unit of byte, page, sector, block and chip with the least program and erase disturbances.

19 Claims, 23 Drawing Sheets

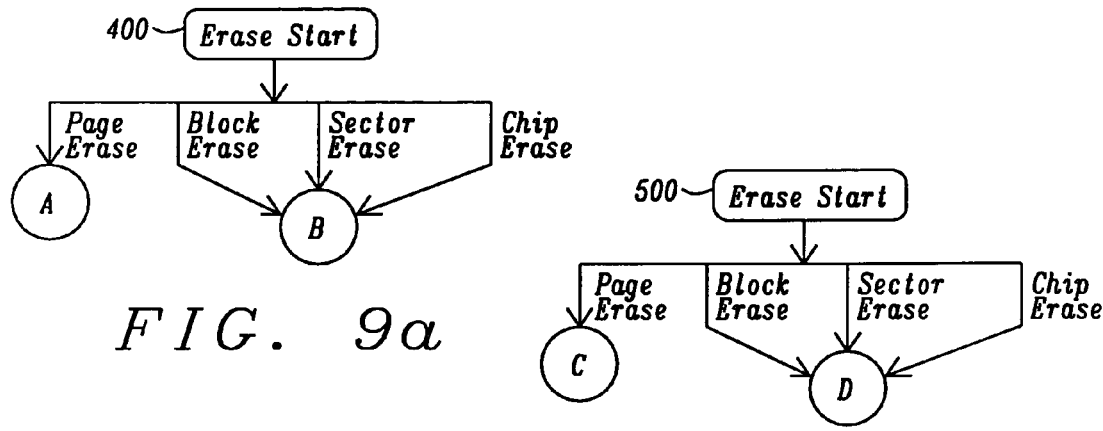
FIG. 9a
FIG. 9b
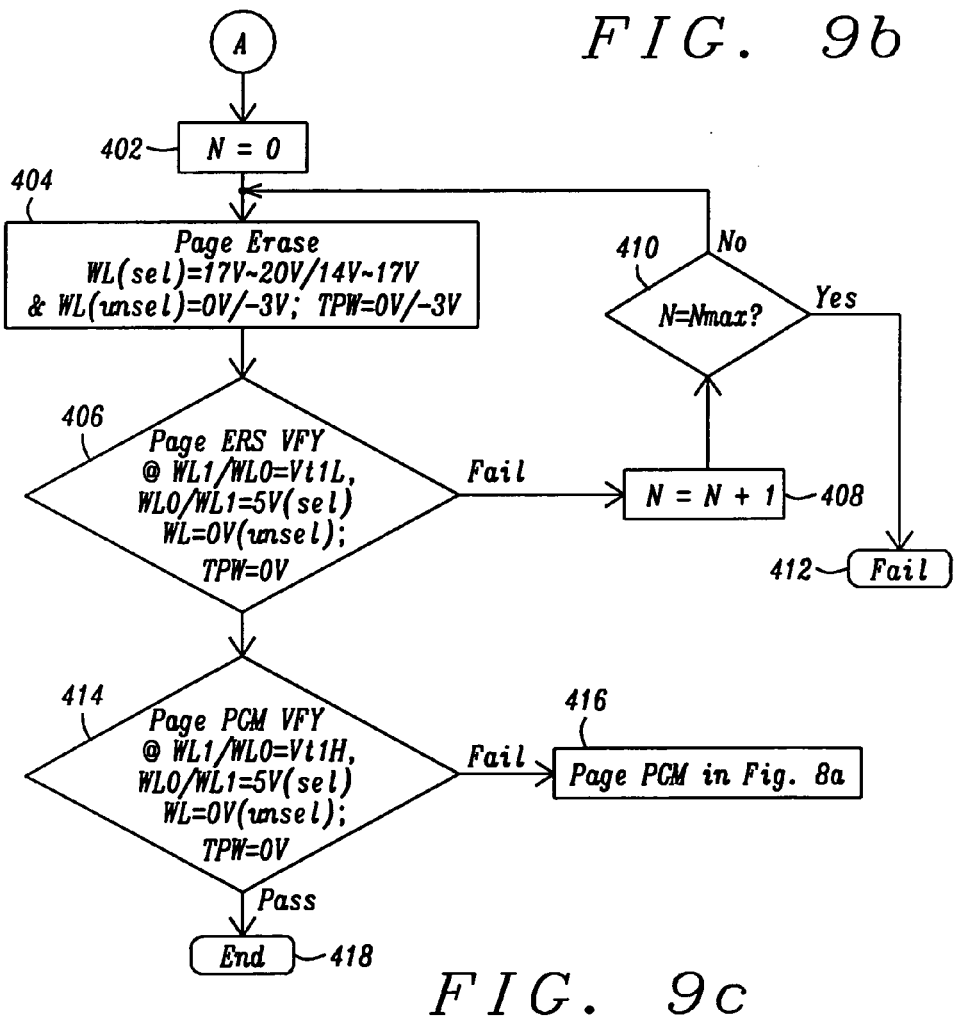
FIG. 9c

| | | SEL Sector | | | | | | | | |
|---|---|---|---|---|---|---|---|---|---|---|
| Voltage \ Mode | Unsel Paired WL | Set Paired WL | | LBL | LSL | BLC | | SLC | | TPW |
| | | Sel | Unsel | | | Sel | Un-sel | Sel | Un-sel | |
| Read | 0V | VR | Vpass | 1V | 0V | Vdd | 0V | Vdd | 0V | 0V |

Vdd=1.6V~1.8V or 2.7V~3.6V; VR=2.7V; Vpass=5V

FIG. 10

| | | SEL Sector | | | | | | | | |
|---|---|---|---|---|---|---|---|---|---|---|
| Voltage \ Mode | Unsel Paired WL | Set Paired WL | | LBL | LSL | BLC | | SLC | | TPW |
| | | Sel | Unsel | | | Sel | Un-sel | Sel | Un-sel | |
| Page Program | 0V | -12V~-17V | 0V | 3V/-3V | 3V/-3V | 5V | -3V | 5V | -3V | -3V |
| Page Program Verify | 0V | VtOH | Vpass | Vdd-Vt/0V | 0V | Vdd | 0V | Vdd | 0V | 0V |

Vpass=5V

FIG. 11a

| | | SEL Sector | | | | | | | | |
|---|---|---|---|---|---|---|---|---|---|---|
| Voltage \ Mode | Unsel Paired WL | Set Paired WL | | LBL | LSL | BLC | | SLC | | TPW |
| | | Sel | Unsel | | | Sel | Un-sel | Sel | Un-sel | |
| Page Program | 0V | 0V | 12V~17V | 3V/-3V | 3V/-3V | 5V | -3V | 5V | -3V | -3V |
| Page Program Verify | 0V | Vpass | Vt1L | Vdd-Vt/0V | 0V | Vdd | 0V | Vdd | 0V | 0V |

Vpass=5V

FIG. 11b

| SEL Sector | | | | | | | | | | | |
|---|---|---|---|---|---|---|---|---|---|---|---|
| Voltage \ Mode | Unsel Paired WL | Set Paired WL | | LBL | LSL | BLC | | SLC | | TPW |
| | | Sel (WL0/WL1) | Unsel (WL1/WL10) | | | Sel | Un-sel | Sel | Un-sel | |
| Page Erase | 0V | 17V~20V/ 14V~17V | 0V/-3V | 0V/-3V | 0V/-3V | 0V | 0V | 0V | 0V | 0V/-3V |
| Page Erase Verify | 0V | Vt1L | Vpass | Vdd-Vt /0V | 0V | Vdd | 0V | Vdd | 0V | 0V |
| Block/Sector /Chip Erase | 0V | 17V~20V/ 14V~17V | 0V/-3V | 0V/-3V | 0V/-3V | 0V | 0V | 0V | 0V | 0V/-3V |
| Block/Sector /Chip Erase Verify | 0V | Vt1L | Vt1L | Vdd-Vt /0V | 0V | Vdd | 0V | Vdd | 0V | 0V |
| Page Program in Erase | 0V | -14V~ -17V | 0V | 3V/-3V | 3V/-3V | 5V | -3V | 5V | -3V | -3V |
| Page Program Verify in Erase | 0V | Vt1H | Vpass | Vdd-Vt /0V | 0V | Vdd | 0V | Vdd | 0V | 0V |

*FIG. 12a*   Vpass=5V

| SEL Sector | | | | | | | | | | | |
|---|---|---|---|---|---|---|---|---|---|---|---|
| Voltage \ Mode | Unsel Paired WL | Set Paired WL | | LBL | LSL | BLC | | SLC | | TPW |
| | | Sel (WL0/WL1) | Unsel (WL1/WL10) | | | Sel | Un-sel | Sel | Un-sel | |
| Upper WL Page Erase | 0V | -17V~20V/ -14V~17V | 0V/-3V | 0V/-3V | 0V/-3V | 0V | 0V | 0V | 0V | 0V/3V |
| Lower WL Page Erase | 0V | 0V | -17V~20V/ -14V~17V | 0V/-3V | 0V/-3V | 0V | 0V | 0V | 0V | 0V/3V |
| Upper WL Page Erase Verify | 0V | 0V/3V | Vpass | 1V/0V | 1V | Vdd | 0V | Vdd | 0V | 0V |
| Lower WL Page Erase Verify | 0V | Vpass | 0V | 1V/0V | 1V | Vdd | 0V | Vdd | 0V | 0V |
| Page Program in Erase | 0V | 14V~17V (sel) | 0V (Unsel) | 3V/-3V | 3V/-3V | 5V | -3V | 5V | -3V | -3V |
| Page Program Verify in Erase | 0V | Vt0L | Vpass (Unsel) | Vdd-Vt /0V | 0V | Vdd | 0V | Vdd | 0V | 0V |

*FIG. 12b*   Vpass=5V

WRITE BIAS CONDITION FOR 2T-STRING NOR FLASH CELL

This application claims priority to U.S. Provisional Patent Application Ser. No. 61/402,782, filed Sep. 3, 2010 which is owned by a common assignee, and which is herein incorporated by reference in its entirety.

BACKGROUND OF INVENTION

Field of Invention

This invention discloses a circuit of a NAND-based 2T-string NOR flash cell structure as a building block for a fast random-read NOR flash memory. The key concept of this new set of the bias conditions in cell array provides the dramatic improvement over the most critical concern of punch-through issue when cell is migrating to the more advanced technology node of next generation.

The approach of the present invention adopts a novel preferable symmetrical 2T-string NOR flash cell, which is based on today's most-scalable NAND flash technology. Each NAND or NAND like cell of this 2T-string NOR cell is to store 2 bits and is preferable to be made of N-channel device, regardless of 1-poly SONOS-type Nitride-trapping or 2-poly floating-gate type cell structure. The cell is preferable to use Fowler-Nordheim Tunneling scheme for both erase and program operations for the present invention.

The present invention is based on a universal circuit scheme that allows it to be implemented in many proven flash technologies with many advantages such as the smallest cell and array size, the lowest program and erase current and the fastest program and erase speed in unit of page.

SUMMARY OF THE INVENTION

The first ($1^{st}$) object of this invention is to provide a novel 2T-string NOR flash cell structure made of N-channel device that offers most flexible erase sizes in unit of byte, page, sector, block and chip with the least program and erase disturbances to achieve the spec of high P/E endurance cycles. The memory cell is preferably operating within the range of +/−20V biased voltages that require the breakdown voltages of the desired peripheral devices tuned to be 20V accordingly with the High-voltage NMOS devices is formed within the triple P-well (TPW) in the deep N-well on the P-substrate.

The second ($2^{nd}$) object of the present invention is to apply the relatively lower voltage of +/−3V to the respective nodes of the sources, drains and bulks of the selected cells that are connected to the selected multiple BLs along with the +/−20V voltages coupled to the cells' gates that are connected to one selected word line for realizing reliable program and program inhibit operations for long P/E endurance cycles;

The third ($3^{rd}$) object of the present invention discloses a preferable method that preferably uses the edge F-N tunneling scheme for performing program operation in junction with the channel F-N scheme for erase operation when N-channel flash cell of embodiment 1 is used;

The fourth ($4^{th}$) object of the present invention discloses another preferable method to use the low-current channel F-N tunneling scheme for performing both program and erase operations when N-channel flash cell of embodiments 2 is used;

The fifth ($5^{th}$) object of the present invention is to show how the over-erase free scheme is being achieved, in which it can prevent the malfunction from happening during the cycle of erase verifying. The over-erase free scheme of the present invention is attributed wholly to the inherent 2T-string NOR flash cell structure associated with the preferable erase flow chart;

The sixth ($6^{th}$) object of the present invention provides a method to completely eliminate the accumulative page erase disturbance on the unselected cells in the unselected word lines by setting the unselected cells' gate voltages of the unselected word line voltage same as the cells' bulk voltage, of which sharing the same TPW.

The seventh ($7^{th}$) object of the present invention provides a method to reduce the accumulative page program disturbance on the unselected cells in the unselected word lines by setting the unselected cells' gate voltages of the unselected word line voltage same as 0V. The TPW voltage of page program condition of this case is preferably set to be −3V.

The eighth ($8^{th}$) object of the present invention discloses a preferable set of values of cells' Vts, of which all Vts are preferable positive, tight-Vt distribution program states, no erased state is allowed for binary storage;

The desired Vt distribution of the $1^{st}$ program-state is set to be within 0.85V~1.15V and the desired Vt distribution of the $2^{nd}$ program state is set to be within 2.85V~3.15V for N-channel 2T-string NOR flash in all the embodiments;

The ninth ($9^{th}$) object of the present invention is to increase the cell's threshold voltage to a value larger than the desired Vt1L in the erase operation of the embodiment 1.

The tenth ($10^{th}$) object of the invention is to do the desired bit-by-bit page program operation that decreases the cells' threshold voltage to a value less than Vt1H, which is the $2^{nd}$ program state in the erase operation of the embodiment 1;

The eleventh ($11^{th}$) object is to decrease the cells' threshold voltage to a value less than ~−1V in the erase operation of the embodiment 2;

The twelfth ($12^{th}$) object of the invention is to bit-by-bit page program increase the cells' threshold voltage to a value larger than Vt0L, which is the desired $1^{st}$ program state in the erase operation of the embodiment 2.

The thirteen ($13^{th}$) object is to do bit-by-bit page program to decrease cells' threshold voltage to a value less than Vt0H, which is the preferable $1^{st}$ program state in the program operation of the embodiment 1.

The fourteenth ($14^{th}$) object is to bit-by-bit page program to increase cells' threshold voltage to a value larger than Vt1L, which is the preferable $2^{nd}$ program state in the program operation of the embodiment 2.

The fifteenth ($15^{th}$) object is to provide a program scheme that keeps zero voltage drop between the respective drain node and the source node of the selected cells to prevent channel punch-through from happening.

In accordance to the objects of the invention a random-read NOR flash memory array that offers most flexible erase sizes comprising one or more memory sectors has been achieved, each sector, firstly, comprising: N+1 word lines, K local sub-bit lines, which are perpendicular to the word-lines, K local sub-source lines, which are perpendicular to the word-lines, (K+1)/2 global bit lines, wherein every two sub-bit lines are decoded to form one of said global bit lines, and (K+1)/2 global source lines, wherein every two sub-source lines are decoded to form one of said global source lines, and (N+1)/2×K flash memory cells, wherein each flash memory cell is a NAND-based N-channel 2T-string NOR flash memory cell device storing two bits. Furthermore the cells can be coupled with appropriate bias condition in circuit for respective operation, comprising: a first and a second storage NMOS transistor in series without common source line, a drain/source node, which is connected to a corresponding local sub-bit line, wherein the local sub-bit line and a local sub-source line are perpendicular to word lines, and a source/drain node, which is connected to the corresponding local sub-source line. Moreover each cell comprises a first word line terminal, which is connected to a word line corresponding to the first transistor, a second word line terminal, which is connected to a word line corresponding to the second transistor, two gates of said two transistors, each transistor comprising a gate dielectric layer underneath of each of said gates, a floating gate underneath of each said dielectric layer, and a tunneling oxide layer underneath of each of floating gates. Furthermore each cell comprises a common triple P-well region underneath said tunneling oxide layers comprising a N+ drain/source region connected to said drain/source node, and a N+ source/drain region connected to said source/drain node. Finally each cell comprises a deep N-well region underneath the triple P-well region and an active P-SUB region underneath the deep N-well region.

In accordance with the objects of the invention a method to achieve a flash memory cell structure offering most flexible erase sizes is disclosed. The method invented comprising the steps of (1) providing a random read NOR flash memory array comprising a multitude of word lines, a multitude of local sub-bit lines, and a multitude of local sub-source lines, wherein each flash memory cell is a NAND-based N-channel 2T-string NOR flash memory cell device storing two bits comprising two storage transistors each having a gate, a floating gate, and a tunneling oxide layer underneath the floating gate, furthermore comprising a common triple P-well region underneath said tunneling oxide layers, (2) coupling said memory cells with appropriate bias condition in circuit according to first or second embodiments of the invention for respective operation, (3) enabling the flash memory cell to performing page program operations according to first or second embodiments, and (4) enabling the flash memory cell to performing multiple kinds of erase operations according to first or second embodiments.

BRIEF DESCRIPTION OF THE DRAWINGS

FIG. 9a is a flow chart of erase operation for N-channel 2T-string NOR flash of embodiment 1.

FIG. 9b is a flow chart of erase operation for N-channel 2T-string NOR flash of embodiment 2.

FIG. 9c is a flow chart of page erase operation for N-channel 2T-string NOR flash of embodiment 1.

FIG. 10 is a table of the read operation for N-channel 2T-string NOR flash of all the embodiments.

FIG. 11a is a table of the page program operation for N-channel 2T-string NOR flash of the embodiment 1.

FIG. 11b is a table of the page program operation for N-channel 2T-string NOR flash of the embodiment 2.

FIG. 12a is a table of the erase operation for N-channel 2T-string NOR flash of the embodiment 1.

FIG. 12b is a table of the erase operation for N-channel 2T-string NOR flash of the embodiment 2.

THE DETAILED DESCRIPTION OF THE INVENTION

Figure 1A:
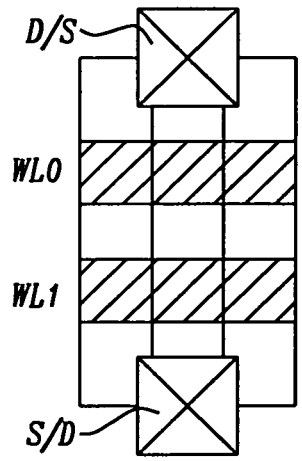
FIG. 1a is N-channel 2T-string NOR flash cell layout.

FIG. 1a is a plane layout view of a N-channel 2T-string NOR flash. By solving the punch through problem with the voltage difference between drain & source during program, this 2T-string structure is employed by 2 NMOS in series without common source line. Only four key cell's connection terminals of Drain/Source (N-active), Source/Drain (N-active), two cell's Gate (Poly2) of storage device, are shown and denoted as "D/S, S/D, WL0 and WL1" respectively. The "S/D" node hash-Contact for a source line connection and "D/S" node has ½-Contact for a bit line connection.

Figure 1B:
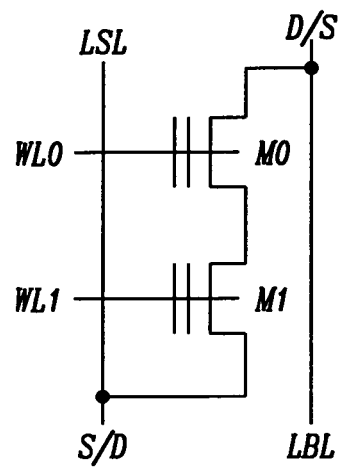
FIG. 1b is N-channel 2T-string NOR flash equivalent circuit.

FIG. 1b shows a schematic symbol of N-channel 2T-string NOR flash according to FIG. 1a of the present invention. Both the storage transistors of M0 & M1 are made of 2-poly cells. The shown 2T-string NOR flash cell circuit is a four-terminal with four terminals include D/S, WL0, WL1 and S/D. The "D/S" mode is connected to a local vertical metal bit line denoted as "LBL" and the "S/D" node is connected to a local vertical metal source line denoted as "LSL". Unlike the traditional NOR flash array connection, each NOR string of the present invention has two dedicated metal lines of "LBL and LSL", which are preferred to run vertically in y-direction and are perpendicular to the horizontal word lines in X-direction. No more common source lines that are shared by many prior art NOR flash of the present invention.

Figure 1C:
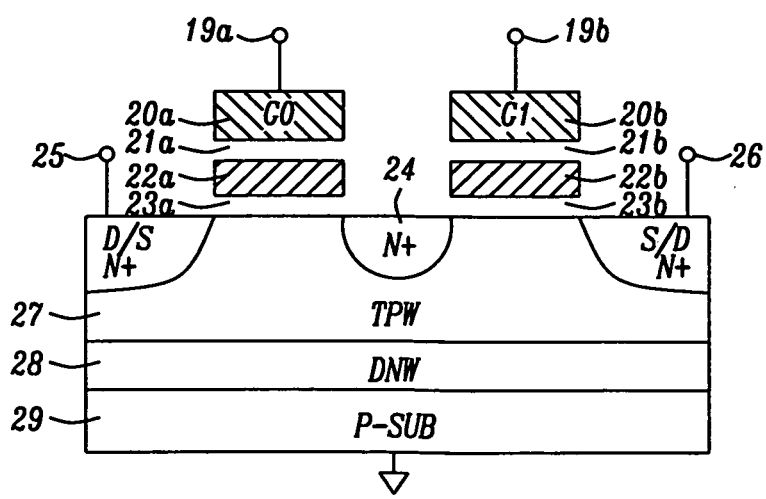
FIG. 1c is N-channel 2T-string NOR flash cross sectional view.

FIG. 1c shows a cross sectional view of N-channel 2T-string NOR flash cell according to FIG. 1a. Both transistors of M0 and M1 are made of poly2 conduction layer. The two poly2-gates are denoted as "G0 and G1" 19a & 19b. G0 is the poly2-gate of 2-poly storage transistor of M0 and G1 is the poly2-gate of another 2-poly flash storage transistor of M1. As explained above, all six nodes D/S 25, G0 19a, G1 19b, S/D 26, TPW 27, DNW 28 and PSUB 29 of a dual N-channel 2T-string NOR flash have to be coupled with the appropriate bias condition in circuit for respective operation. Underneath the poly2, this NMOS device transistor has ONO as the gate dielectric shown as 21a & 21b, poly1 floating gates 22a & 22b & tunneling oxide 23a & 23b. In the embodiment 2, the electrons injected from TPW 27 can be retained in the floating gates 22a or 22b while programming. On the contrary, the stored electrons in the floating gates 22a or 22b could be pulled out toward TPW 27 while erasing. In the embodiment 1, the electrons injected from TPW 27 can be retained in the floating gates 22a or 22b while erasing. On the contrary, the stored electrons in the floating gates 22a or 22b could be pulled out toward D/S 25 or S/D 26 while programming.

Figure 1D:
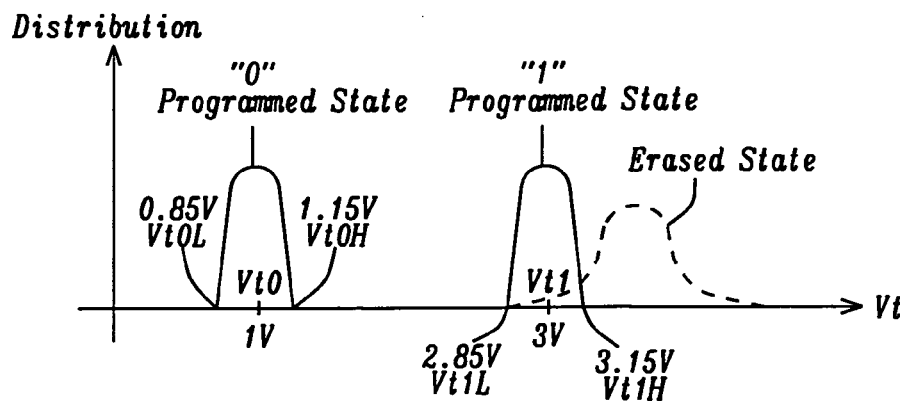
FIG. 1d is N-channel 2T-string NOR flash Vt distribution of embodiment 1.

FIG. 1d shows a chart of two threshold voltage Vt distributions for the storage transistors M0 & M1 in SLC (2 states) case of embodiment 1. The Vt can be bit-by-bit programmed to a tightened distribution. This Vt1 of $2^{nd}$ program-state is set with a preferred center value of 3V, ranging from Vt1L voltage 2.85V to Vt1H voltage 3.15V in accordance with the present invention. This Vt0 of $1^{st}$ program-state is set with a preferred center value of 1.0V, ranging from Vt0L voltage 0.85V to Vt0H voltage 1.15V in accordance with the present invention. The voltage values mentioned above could vary according to specific semiconductor properties. Therefore, the tightened threshold of on-state cell could be obtained. Details will be explained in the flow charts of FIGS. 8a, 9a, 9c & 9d. During the erase operation, the Vt distribution cannot be controlled as tightened as the two program states because of the collective operation with a large amount of erase size such as page/block/sector/chip. The slow cells and fast cells exist at two most ends of the distribution, which indicates the behavior of Vt shifting caused by the Fowler-Nordheim tunneling scheme. This Vt center value is larger than the one of the $2^{nd}$ program state. During the read operation, the gate voltage of the selected cell is applied to 2.7V for VDD=1.7V-1.9V or VDD=2.7V-3.6V and the paired adjacent gate voltage is applied to 5V to turn on the possible off-cell (maximum threshold voltage 3.15V). All the other unselected gate voltage is applied to 0V. Therefore, it can achieve the low series resistance with high enough current while applying for the high-speed application.

Figure 1E:
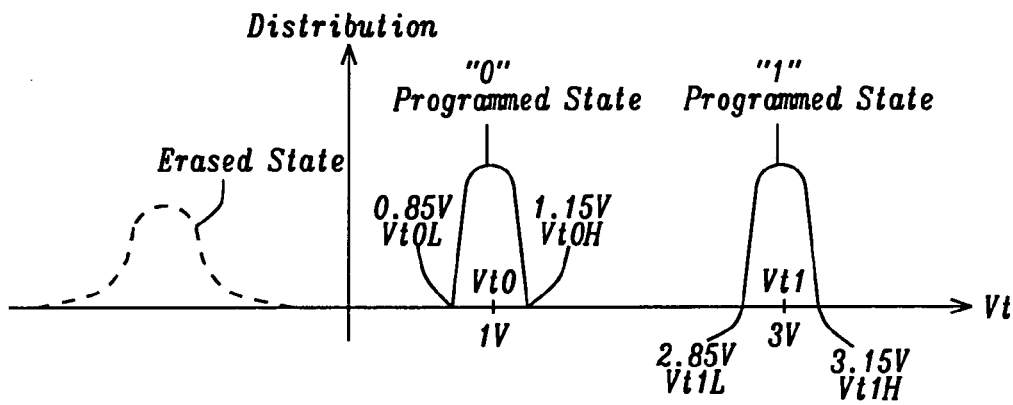
FIG. 1e is N-channel 2T-string NOR flash Vt distribution of embodiment 2.

FIG. 1e shows another chart of two Vt distributions for the storage transistors M0 & M1 in SLC (2 states) case of embodiment 2. The Vt can be bit-by-bit programmed to a tightened distribution. This Vt1 of $2^{nd}$ program-state is set with a preferred center value of 3V, ranging from Vt1L voltage 2.85V to Vt1H voltage 3.15V in accordance with the present invention. This Vt0 of $1^{st}$ program-state is set with a preferred center value of 1.0V, ranging from Vt0L voltage 0.85V to Vt0H voltage 1.15V in accordance with the present invention The two program states are defined similarly as the ones in the embodiment 1. Details will be explained in the flow charts of FIGS. 8b, 9b, 9e, 9f & 9g. During the erase operation, the Vt distribution cannot be controlled as tightened as the two program states because of the collective operation with a large amount of erase size such as page/block/sector/chip. The slow cells and fast cells exist at two most ends of the distribution, which indicates the behavior of Vt shifting caused by the Fowler-Nordheim tunneling scheme. This Vt center value is less than the one of the 1st program state. Owing to the 2T-string structure with two NMOS in series, block erase, sector erase and chip erase can be done by half size consecutively (lower pages erase firstly and the upper pages erase thereafter). In other words, there is no over-erase concern. During lower/upper pages erase operation, all the cells' threshold voltage<Vt0L will be bit-by-bit programmed back. During the read operation, the gate voltage of the selected cell is applied to 2.7V for VDD=1.7V-1.9V or VDD=2.7V-3.6V and the paired adjacent gate voltage is applied to 5V to turn on the possible off cell (maximum threshold voltage 3.15V). All the other unselected gate voltage is applied to 0V. Therefore, it can achieve the low series resistance with high enough current while applying for the high-speed application.

Figure 2A:
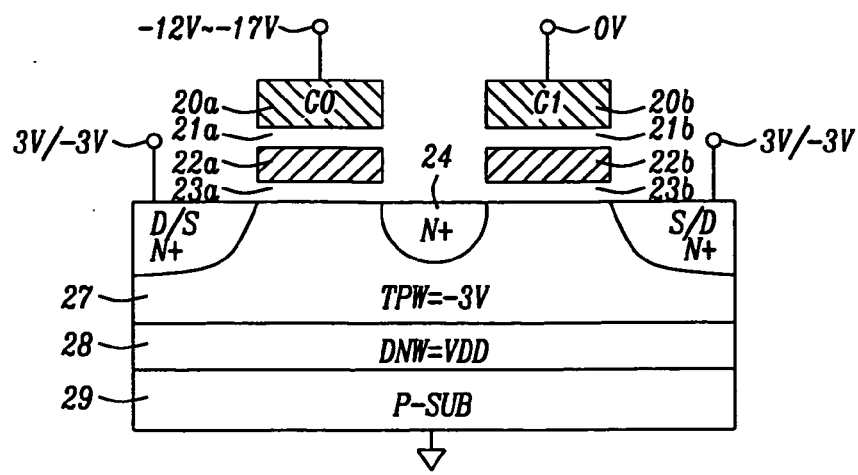
FIG. 2a is a page program bias condition on N-channel 2T-string NOR flash of embodiment 1.

FIG. 2a shows a biased voltage on the N-channel 2T-string NOR Flash during the program operation of embodiment 1. By setting −12V~−17V & 0V to G0 & G1, +3V/−3V to N+D/S & N+ S/D and −3V to TPW, the Fowler-Nordheim tunneling occurs at the overlap region between the floating gate and N+ D/S. The more electrons will be pulled out from the floating gate to the N+ D/S for +3V program case. The threshold voltage becomes decreased as a $1^{st}$ program state. On the contrary, the fewer electrons will be pulled out from the floating gate to the N+ D/S for −3V program inhibit case because of the relatively small electric field compared to the former one. Owing to 0V difference between N+ D/S & N+ S/D without the acceleration by the lateral electric field, relatively less hot hole will be injected to the floating gate to degrade the tunneling oxide. Also, no punch-through problem needs to be taken into consideration because of Vds=0V. In other words, high cell scalability could be further achieved by this 2T-string structure.

Figure 2B:
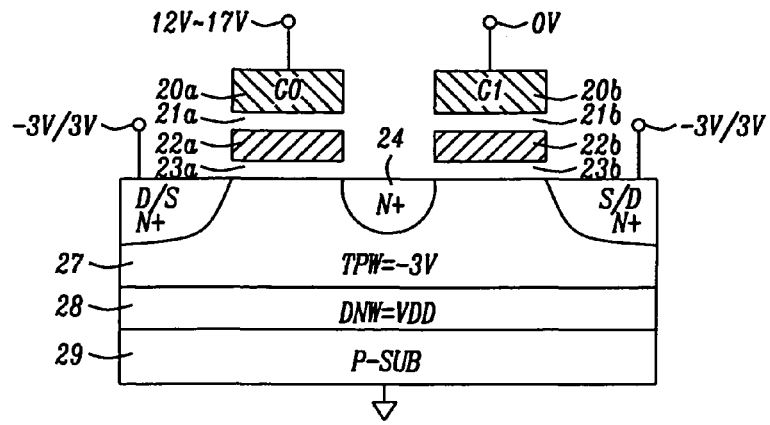
FIG. 2b is a page program bias condition on N-channel 2T-string NOR flash of embodiment 2.

FIG. 2b shows a biased voltage on the N-channel 2T-string NOR Flash during the program operation of embodiment 2. By setting 12V~17V & 0V to G0 & G1, −3V/+3V to N+ D/S & N+ S/D and −3V to TPW, the Fowler-Nordheim tunneling occurs at the overlap region between the floating gate and TPW. The more electrons will be pulled out from the TPW to the floating gate for −3V program case. The threshold voltage becomes increased as a $2^{nd}$ program state. On the contrary, the fewer electrons will be pulled out from the TPW to the floating gate for +3V case because of the relatively small electric field compared to the former one. Owing to 0V difference between N+ D/S & N+ S/D without the acceleration by the lateral electric field, no electron-hole will be generated by junction between N+ SD/N+ DS and TPW. Therefore, no hot-hole will be injected to the floating gate and further degrade the tunneling oxide. Also, no punch-through problem needs to be taken into consideration because of Vds=0V. In other words, high cell scalability could be further achieved by this 2T-string structure.

Figure 3A:
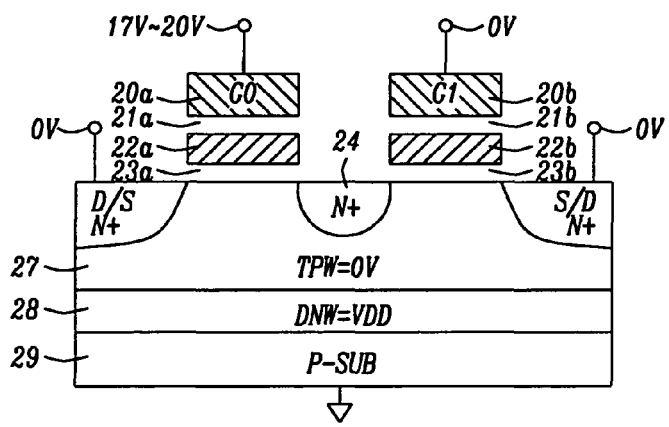
FIG. 3a is a page erase bias condition with TPW=0V on N-channel 2T-string NOR flash of embodiment 1.

FIG. 3a shows a biased voltage with TPW=0V on the N-channel 2T-string NOR Flash during the page erase operation of embodiment 1. By setting 17V~20V & 0V to G0 & G1, 0V to N+ D/S & N+ S/D and 0V to TPW, there is a strong electric field between G0 and TPW and it is rendering the electrons of the TPW to be pulled out through the tunneling insulator toward floating gate by FN tunneling. It ends up with increased threshold voltage. As for the adjacent cell, owing to the applied 0V on G1, no electrons will be pulled out from the floating gate toward the floating gate as an erase inhibit state.

Figure 3B:
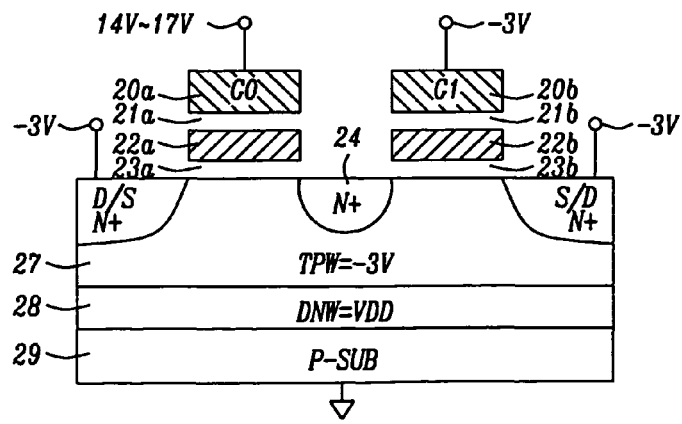
FIG. 3b is a page erase bias condition with TPW=-3V on N-channel 2T-string NOR flash of embodiment 1.

FIG. 3b shows a biased voltage with TPW=−3V on the N-channel 2T-string NOR Flash during the page erase operation of embodiment 1. By setting 14V~17V & −3V to G0 & G1, −3V to N+ D/S & N+ S/D and −3V to TPW, there is a strong electric field between G0 and TPW and it is rendering the electrons of the TPW to be pulled out through the tunneling insulator toward floating gate by FN tunneling. It ends up with increased threshold voltage. As for the adjacent cell, owing to the applied −3V on G1, no electrons will be pulled out from TPW toward the floating gate. In other words, there is no accumulated erase disturb stress occurring.

Figure 3C:
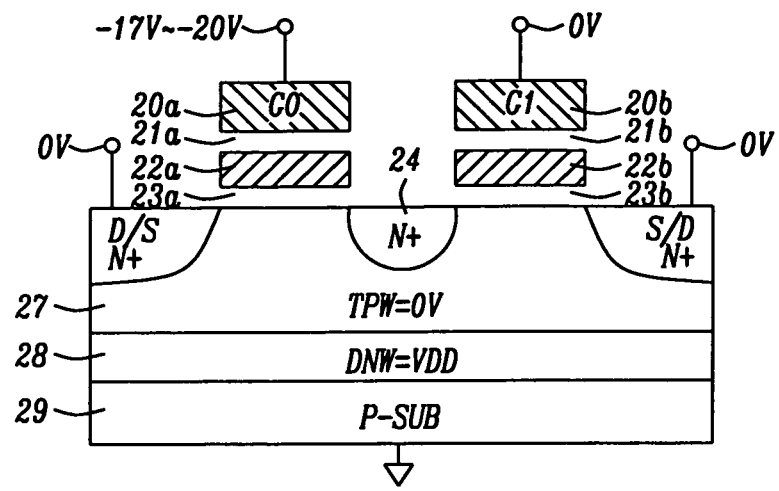
FIG. 3c is a page erase bias condition with TPW=0V on N-channel 2T-string NOR flash of embodiment 2.

FIG. 3c shows a biased voltage with TPW=0V on the N-channel 2T-string NOR Flash during the page erase operation of embodiment 2. By setting −17V~−20V & 0V to G0 & G1, 0V to N+ D/S & N+ S/D and 0V to TPW, there is a strong electric field between G0 and TPW and it is rendering the electrons of the floating gate to be pulled out through the tunneling insulator toward TPW by FN tunneling. It ends up with decreased threshold voltage. As for the adjacent cell, owing to the applied 0V on G1, no electrons will be pulled out from the floating gate toward TPW as an erase inhibit state.

Figure 3D:
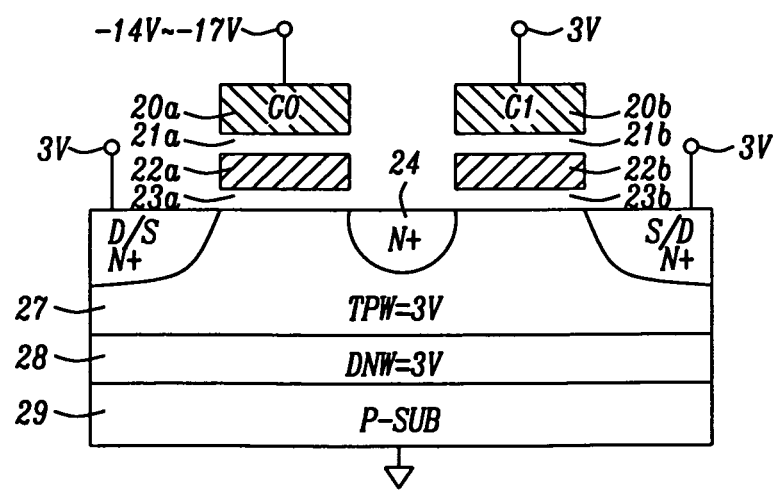
FIG. 3d is a page erase bias condition with TPW=3V on N-channel 2T-string NOR flash of embodiment 2.

FIG. 3d shows a biased voltage with TPW=3V on the N-channel 2T-string NOR Flash during the page erase operation of embodiment 2. By setting −14V~−17V & 3V to G0 & G1, 3V to N+ D/S & N+ S/D and 3V to TPW, there is a strong electric field between G0 and TPW and it is rendering the electrons of the floating gate to be pulled out through the tunneling insulator toward TPW by FN tunneling. It ends up with decreased threshold voltage. As for the adjacent cell, owing to the applied 3V on G1, no electron will be pulled out from the floating gate toward TPW. In other words, there is no accumulated erase disturb stress occurring.

Figure 4:
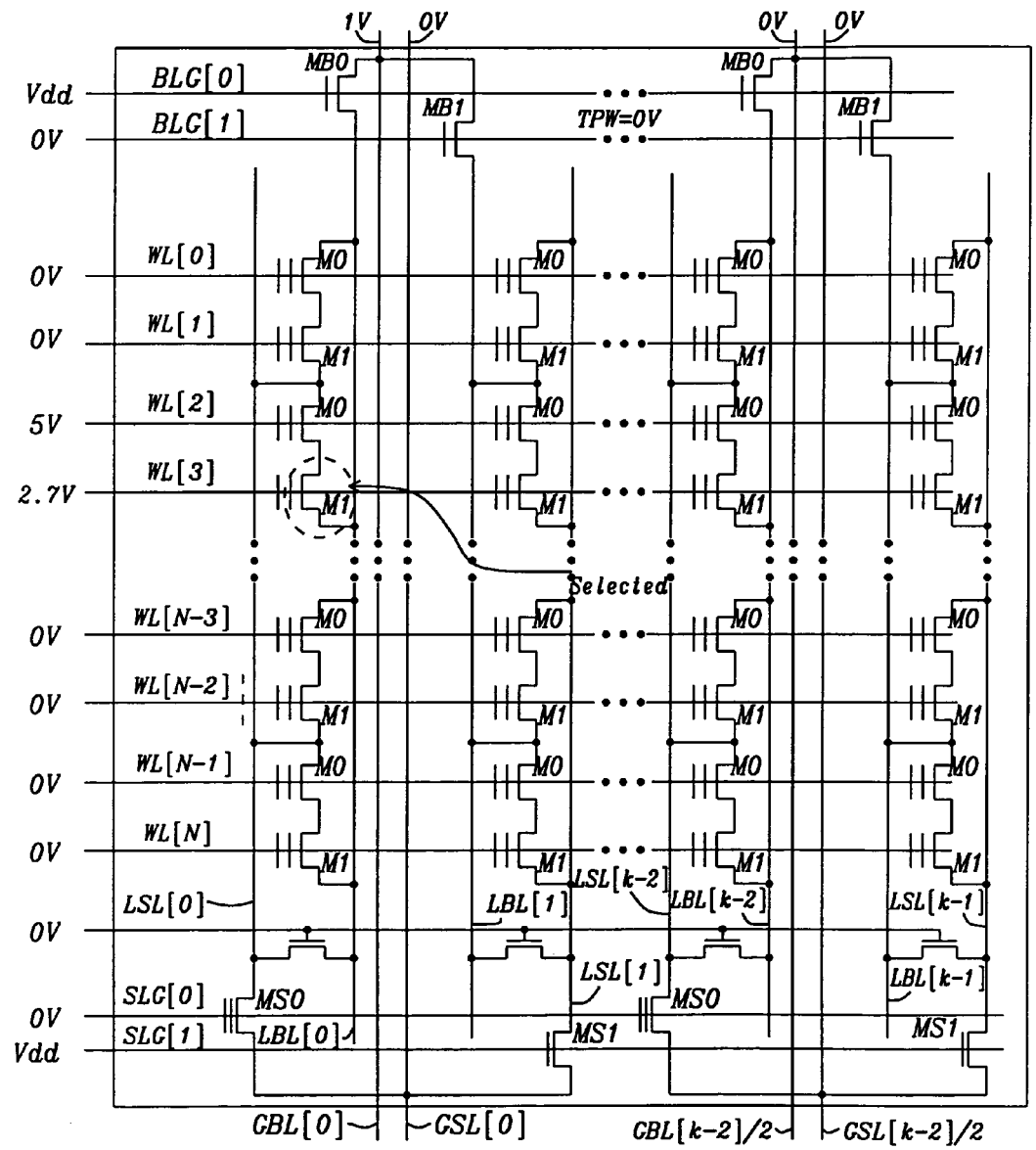
FIG. 4 is a read bias condition in 1 sector of N-channel 2T-string NOR flash array of all embodiments.

FIG. 4 shows the biased voltages on a preferred one sector of N-channel 2T-string NOR Flash array during the read operation of all the embodiments. A sector comprises a plurality of flash cells in N+1 word lines such as WL [0] to WL [N] and a plurality of K sub-bit lines such as LBL [0] to LBL [K−1] and a plurality of K sub-source lines such as LSL [0] to LSL [K−1]. Every two sub-bit lines are decoded by BLG [0] & BLG [1] to form one common global bit line. In a same manner, every two sub-source lines are decoded by SLG [0] & SLG [1] to form one common global source line. There are (K+1)/2 global bit lines from GBL [0] to GBL [k−2]/2 and (K+1)/2 global source lines from GSL [0] to GSL [k−2]/2. Once the read operation is performed, all the unselected cell's WL voltage will be applied to 0V, the global source line & array's TPW are applied to 0V. The selected paired WL voltages are 5V & 2.7V (VDD=2.7V-3.6V or VDD=1.7V-1.9V). The former one will be issued to WL [2] as the pass voltage to turn on the M0 cells even though they may have the maximum threshold voltage (i.e. 3.15V). The latter one will be issued to WL [3] as the selected WL voltage and is used to distinguish the 1$^{st}$ program state or the 2$^{nd}$ program state of M1 cell.

The global bit line GBL [0] is applied to 1V. It will be wired to the sense amplifier by turning on MB0 & MS0 with BLG [0] & SLG [0] to VDD and turning off MB1 & MS1 with BLG [1] & SLG [1] to 0V. The 2$^{nd}$ program state indicated the higher threshold voltage and it will flow no or less cell current once 2.7V WL voltage is applied to M1 cell. It ends up with more positive charge on GBL [0] with 1V+SW. On the contrary, if M1 cell is the 1$^{st}$ program state, it indicates the lower threshold voltage. There will be larger flowing current. It ends up with less positive charge on GBL [0] with 1V-δV2. Owing to the small voltage difference, the next stage of sense amplifier can distinguish which state belongs.

Figure 5:
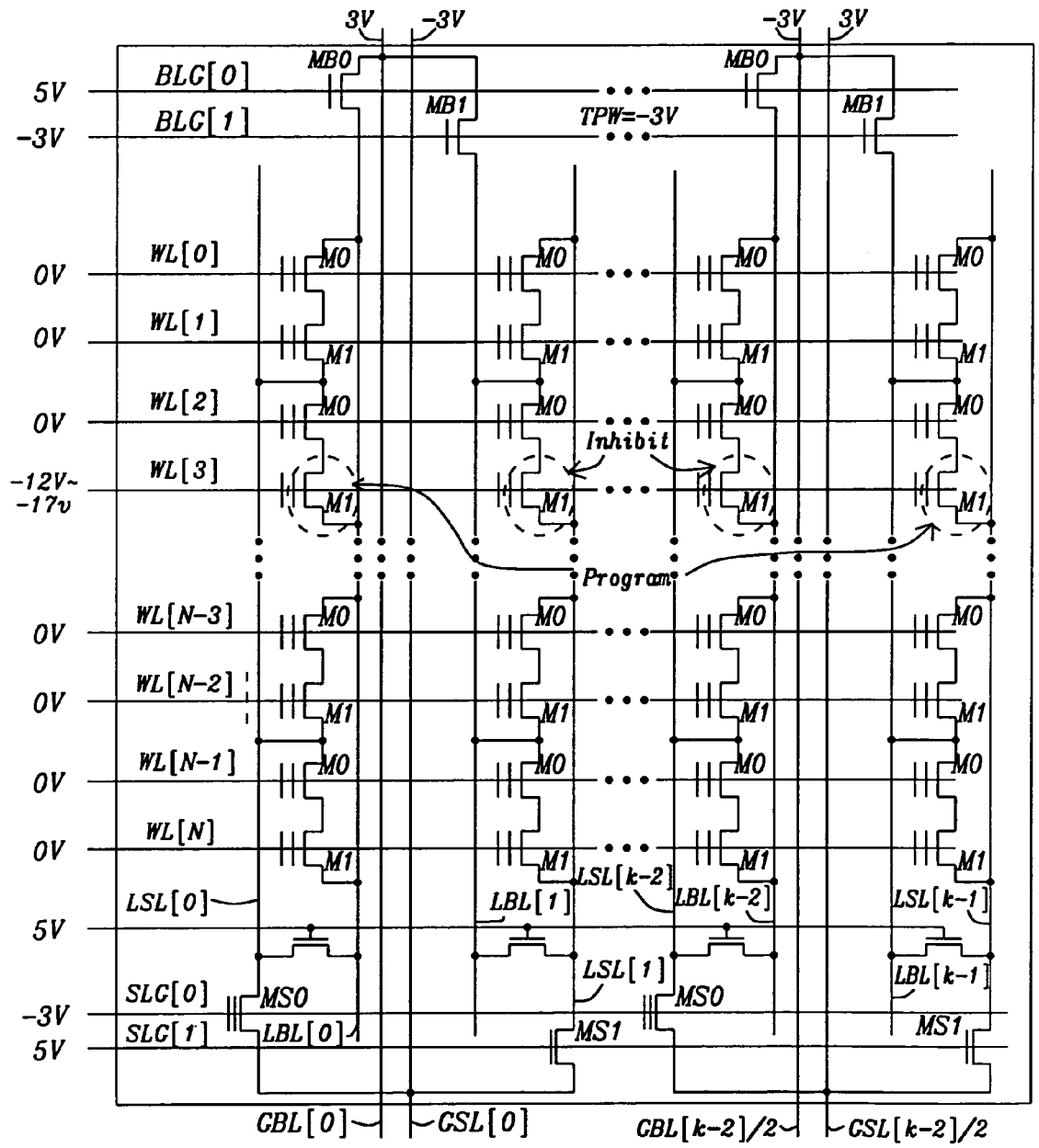
FIG. 5 is a lower WL page program bias condition in 1 sector of N-channel 2T-string NOR flash array of embodiment 1.

FIG. 5 shows the biased voltages on a preferred one sector of N-channel 2T-string NOR Flash array during the page program operation of embodiment 1. Once the page program operation is performed, all the unselected cell's WL voltages are applied to 0V; array's TPW is to −3V. The selected page WL voltage is applied to −12V~−17V. As for the exemplary program data pattern, GBL [0] & GSL [k−2]/2 are applied to 3V for generating enough potential voltage difference with WL [2] by edge Fowler-Nordheim tunneling. On the contrary, for the exemplary program inhibit data pattern, GSL [0] & GBL [k−2]/2 are applied to −3V. The corresponding BLG [0] & SLG [1] are applied to 5V to allow 3V & −3V coupled to the local LBL & LSL. BLG [1] & SLG [0] are tied to −3V to shut off the MB1 & MS0. Therefore, M1 cells along WL [3] coupled to LBL [0] & LSL [k−1] will be programmed to the 1$^{st}$ program state. M1 cells along WL [3] coupled to LBL [1] & LBL [k−2] stays at the original 2$^{nd}$ program state because of the program inhibit operation.

Owing to this 2T-string structure with two NMOS in series, 0V voltage difference between the drain side and the source side could be tolerated with higher voltage without sacrificing the cell scalability.

Figure 6:
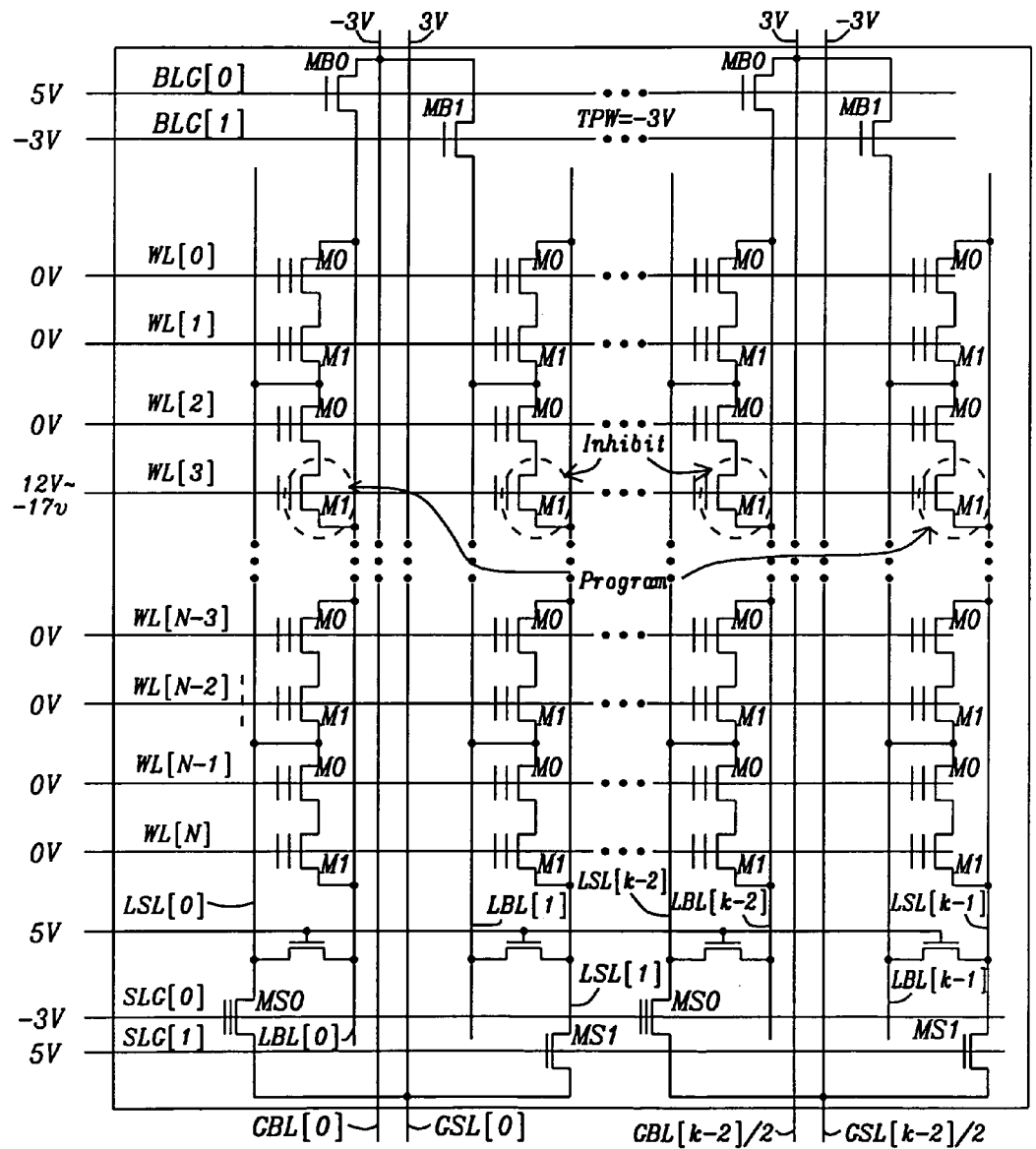
FIG. 6 is a lower WL page program bias condition in 1 sector of N-channel 2T-string NOR flash array of embodiment 2.

FIG. 6 shows the biased voltages on a preferred one sector of N-channel 2T-string NOR Flash array during the page program operation of embodiment 2. Once the page program operation is performed, all the unselected cell's WL voltages are applied to 0V; array's TPW is to −3V. The selected page WL voltage is applied to 12V~17V. As for the exemplary program data pattern, GBL [0] & GSL [k−2]/2 are applied to −3V for generating enough potential voltage difference with WL [2] by channel Fowler-Nordheim tunneling. On the contrary, for the exemplary program inhibit data pattern, GSL [0] & GBL [k−2]/2 are applied to 3V. The corresponding BLG [0] & SLG [1] are applied to 5V to allow 3V & −3V coupled to the local LBL & LSL. BLG [1] & SLG [0] are tied to −3V to shut off the MB1 & MS0. Therefore, M1 cells along WL [3] coupled to LBL [0] & LSL [k−1] will be programmed to the 2$^{nd}$ program state. M1 cells along WL [3] coupled to LBL [1] & LBL [k−2] stays at the original 1$^{st}$ program state because of the program inhibit operation. Owing to this 2T-string structure with two NMOS in series, 0V voltage difference between the drain side and the source side could be tolerated with higher voltage without sacrificing the cell scalability.

Figure 7A:
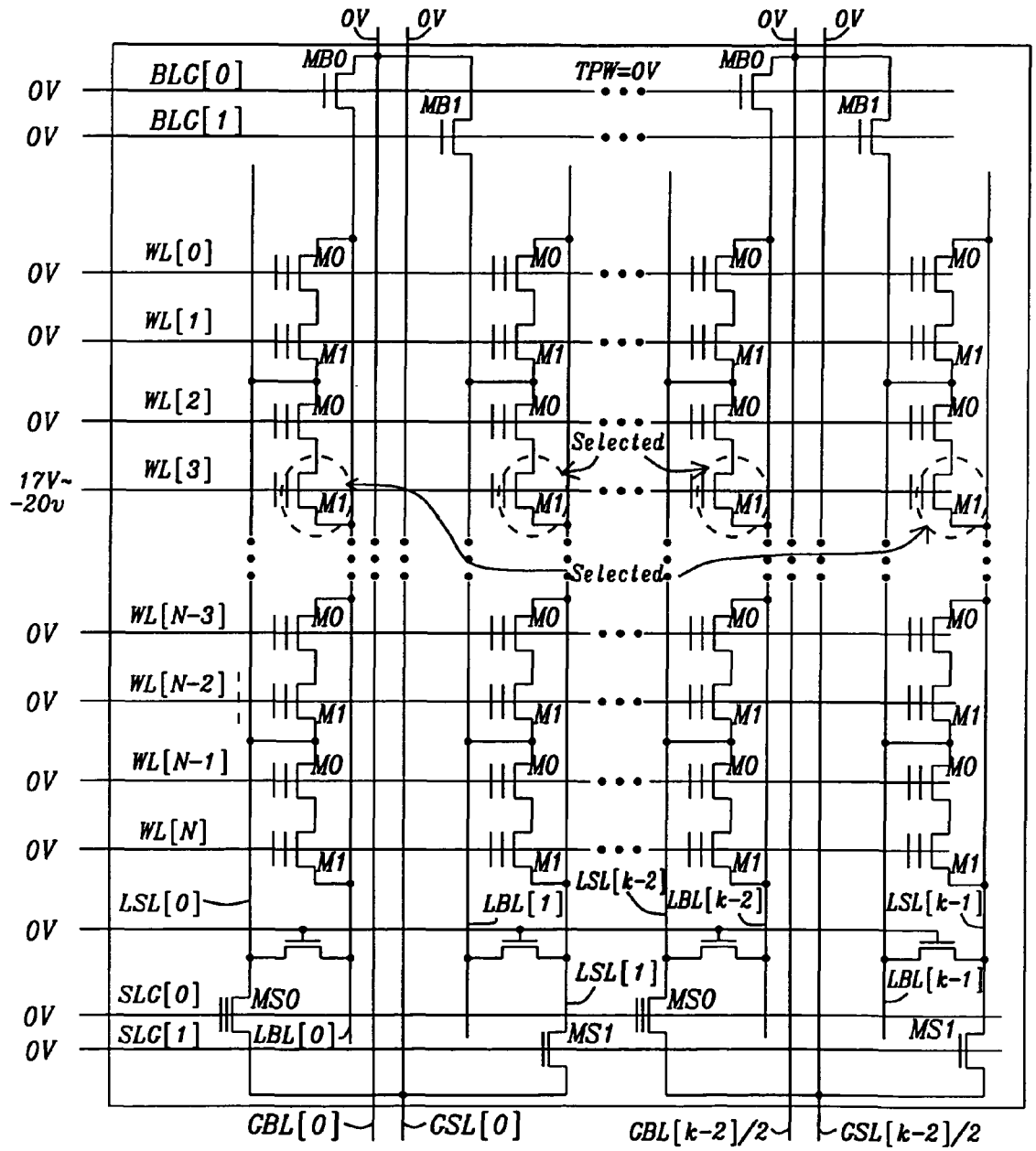
FIG. 7a is a page erase bias condition with TPW=0V in 1 sector of N-channel 2T-string NOR flash array of embodiment 1.

FIG. 7a shows the biased voltages with TPW=0V on a preferred one sector of N-channel 2T-string NOR Flash array during the page erase operation of embodiment 1. The channel Fowler-Nordheim tunneling occurs in this page erase operation. All the global source lines, global bit lines are applied to 0V and array's TPW is applied to 0V as well. There will be no voltage difference between array's TPW & cell's N+ source/drain. As to the BLG [0], BLG [1], SLG [0] & SLG [1], they are all tied to 0V to turn off MB0, MB1, MS0 & MS1. The selected WL [3] is applied to 17V~20V. All the other unselected word lines are applied to 0V. Therefore, M1 cells along WL [3] coupled to LBL [0]-LBL [k−1] will be erased by the channel Fowler-Nordheim tunneling. In other words, the strong electrical field between array's TPW and WL [3] will pull out the electrons from the array's TPW through the tunnel-insulating layer toward the floating gate. It ends up with to increase the threshold voltage by this channel Fowler-Nordheim tunneling. As for the other unselected word lines do not have any stress because of 0V difference between word line and TPW.

Figure 7B:
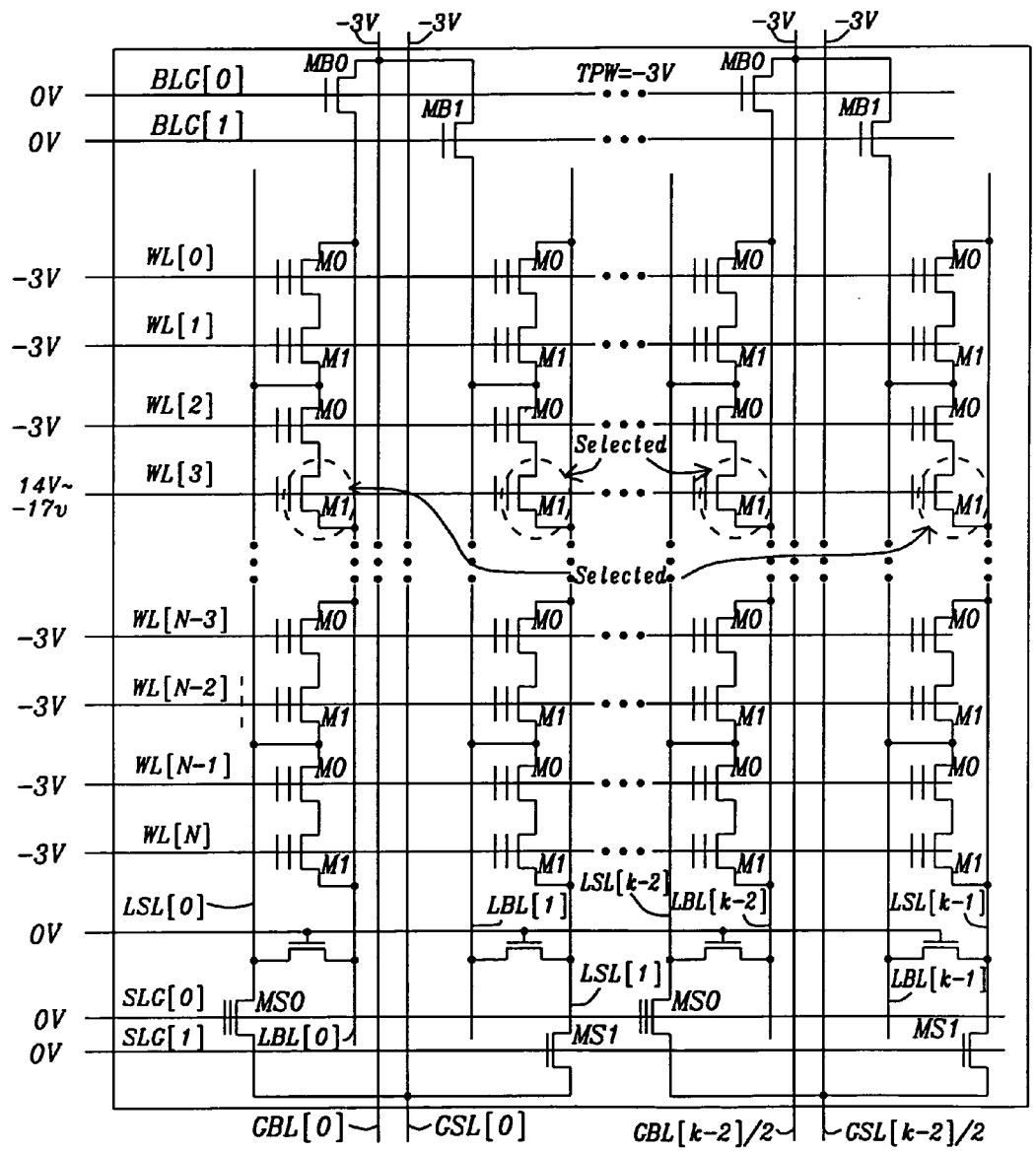
FIG. 7b is a page erase bias condition with TPW=-3V in 1 sector of N-channel 2T-string NOR flash array of embodiment 1.

FIG. 7b shows the biased voltages with TPW=−3V on a preferred one sector of N-channel 2T-string NOR Flash array during the page erase operation of embodiment 1. The channel Fowler-Nordheim tunneling occurs in this page erase operation. All the global source lines, global bit lines are applied to −3V and array's TPW is applied to −3V as well. There will be no voltage difference between array's TPW & cell's N+ source/drain. As to the BLG [0], BLG [1], SLG [0] & SLG [1], they are all tied to 0V to turn on MB0, MB1, MS0 & MS1. The selected WL [3] is applied to 14V~17V. All the other unselected word lines are applied to −3V. Therefore, M1 cells along WL [3] coupled to LBL [0]-LBL [k−1] will be erased by the channel Fowler-Nordheim tunneling. In other words, the strong electrical field between array's TPW and WL [3] will pull out the electrons from the array's TPW through the tunnel-insulating layer toward the floating gate. It ends up with to increase the threshold voltage by this channel Fowler-Nordheim tunneling. What will be on the cells along WL [0], WL [1] & WL [2] if we keep writing the cells along WL [3]? Owing to 0V voltage difference, no accumulated erase disturb stress will occur at all.

Figure 7C:
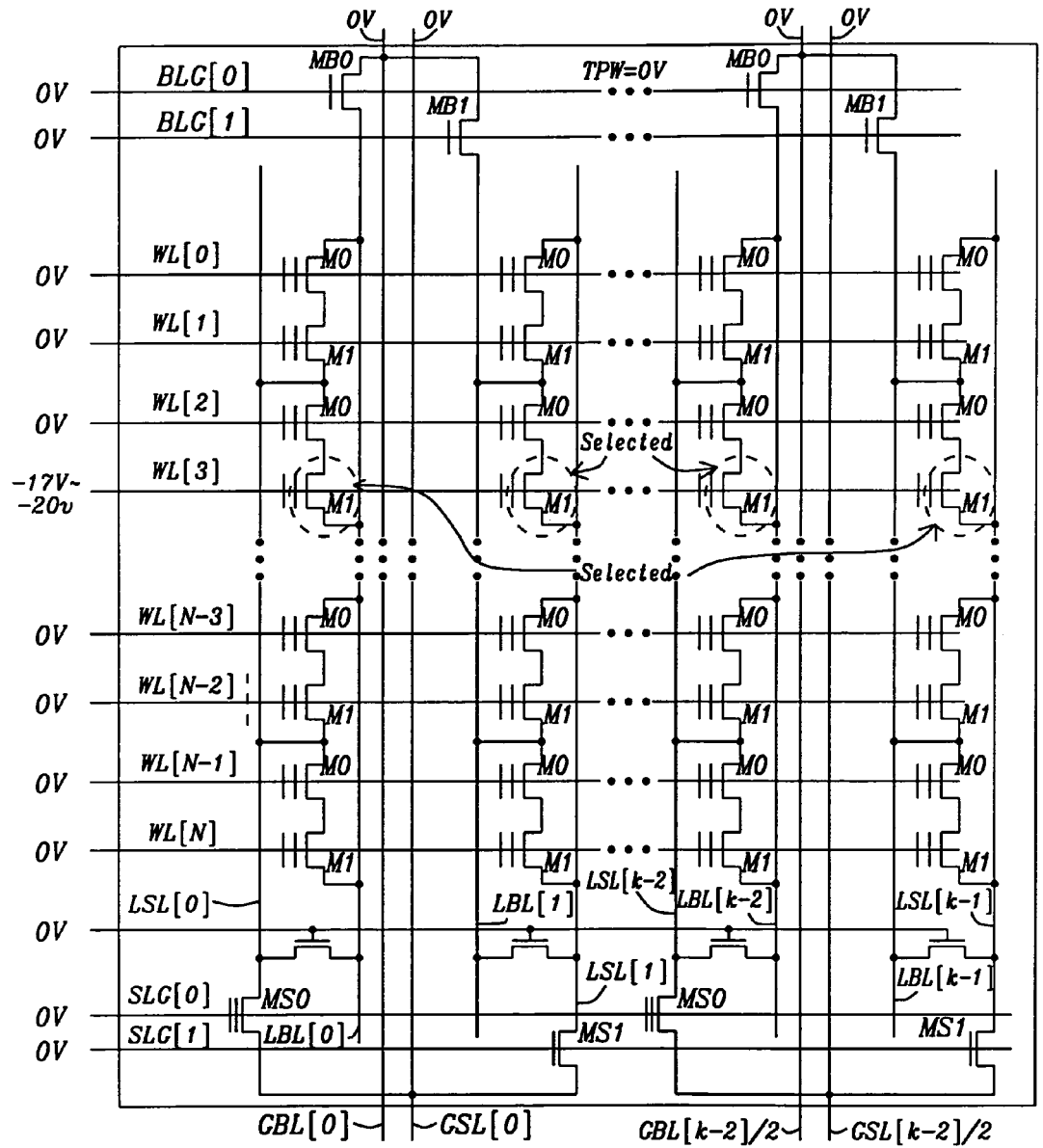
FIG. 7c is a page erase bias condition with TPW=0V in 1 sector of N-channel 2T-string NOR flash array of embodiment 2.

FIG. 7c shows the biased voltages with TPW=0V on a preferred one sector of N-channel 2T-string NOR Flash array during the page erase operation of embodiment 2. The channel Fowler-Nordheim tunneling occurs in this page erase operation. All the global source lines, global bit lines are applied to 0V and array's TPW is applied to 0V as well. There will be no voltage difference between array's TPW & cell's N+ source/drain. As to the BLG [0], BLG [1], SLG [0] & SLG [1], they are all tied to 0V to turn off MB0, MB1, MS0 & MS1. The selected WL [3] is applied to −17V~−20V. All the other unselected word lines are applied to 0V. Therefore, M1 cells along WL [3] coupled to LBL [0]-LBL [k−1] will be erased by the channel Fowler-Nordheim tunneling. In other words, the strong electrical field between array's TPW and WL [3] will pull out the electrons from the floating gate through the tunnel-insulating layer toward the array's TPW. It ends up with to decrease the threshold voltage by this channel Fowler-Nordheim tunneling. As for the other unselected word lines do not have any stress because of 0V difference between word line and TPW.

Figure 7D:
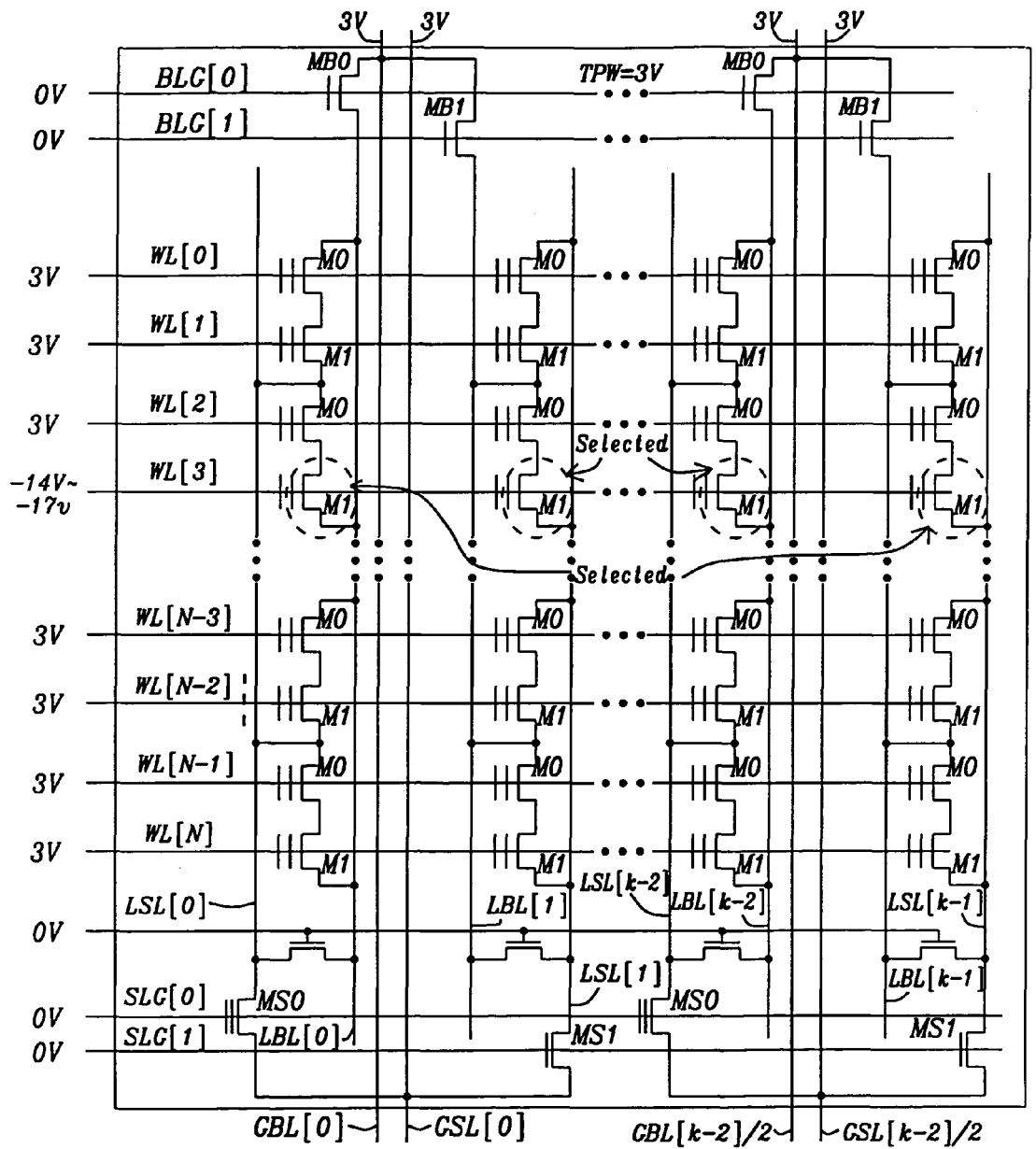
FIG. 7d is a page erase bias condition with TPW=3V in 1 sector of N-channel 2T-string NOR flash array of embodiment 2.

FIG. 7d shows the biased voltages with TPW=3V on a preferred one sector of N-channel 2T-string NOR Flash array during the page erase operation of embodiment 2. The channel Fowler-Nordheim tunneling occurs in this page erase operation. All the global source lines, global bit lines are applied to 3V and array's TPW is applied to 3V as well. There will be no voltage difference between array's TPW & cell's N+ source/drain. As to the BLG [0], BLG [1], SLG [0] & SLG [1], they are all tied to 0V to turn off MB0, MB1, MS0 & MS1. The selected WL [3] is applied to −14V~−17V. All the other unselected word lines are applied to 3V. Therefore, M1 cells along WL [3] coupled to LBL [0]-LBL [k−1] will be erased by the channel Fowler-Nordheim tunneling. In other words, the strong electrical field between array's TPW and WL [3] will pull out the electrons from the floating gate through the tunnel-insulating layer toward the array's TPW. It ends up with to decrease the threshold voltage by this channel Fowler-Nordheim tunneling. What will be on the cells along WL [0], WL [1] & WL [2] if we keep writing the cells along WL [3]? Owing to 0V voltage difference, Owing to 0V voltage difference, no accumulated erase disturb stress will occur at all.

Figure 7E:
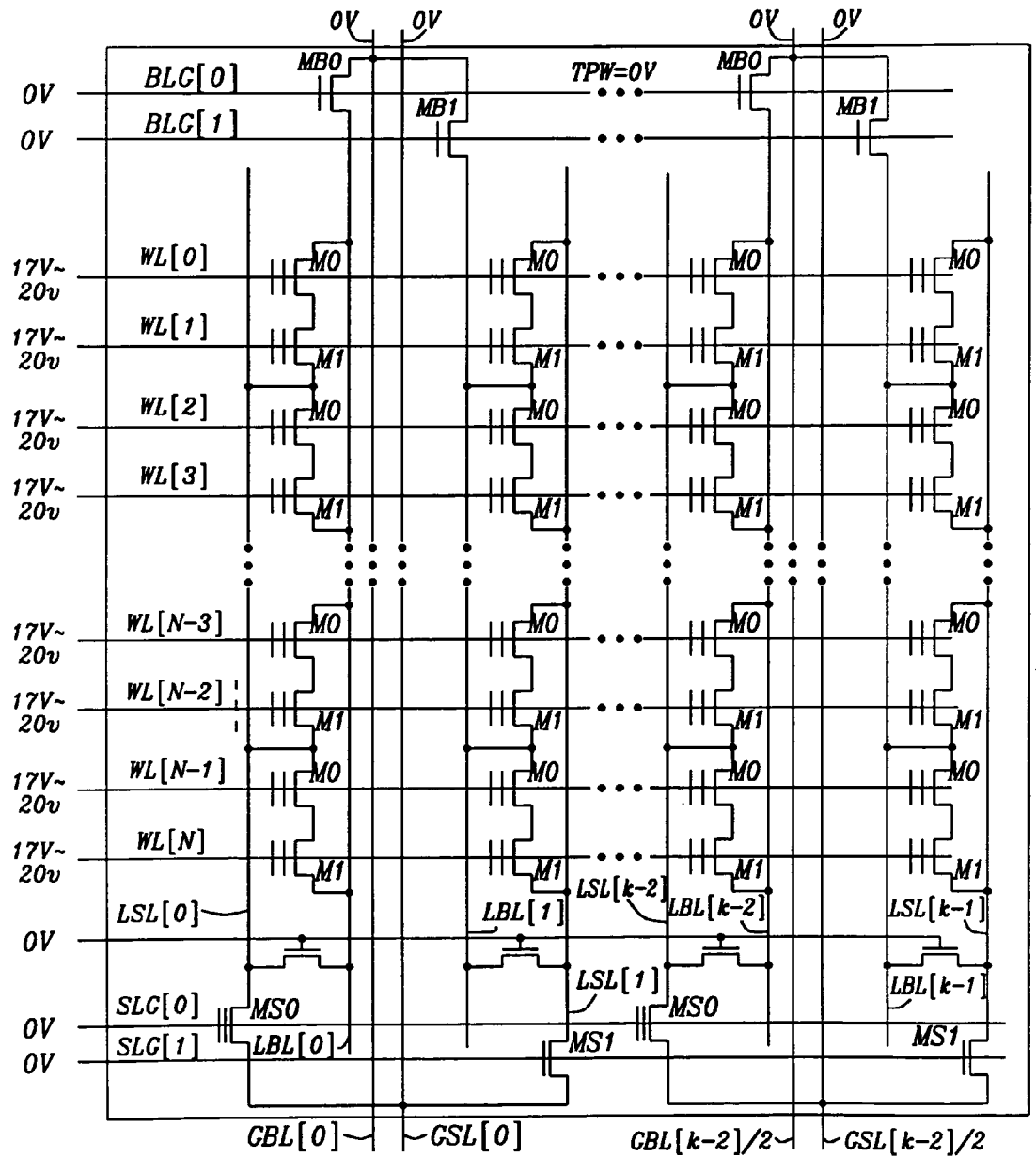
FIG. 7e is a sector erase bias condition with TPW=0V in 1 sector of N-channel 2T-string NOR flash array of embodiment 1.

FIG. 7e shows the biased voltages with TPW=0V on a preferred one sector of N-channel 2T-string NOR Flash array during the sector erase operation of embodiment 1. The channel Fowler-Nordheim tunneling occurs in this sector erase operation. All the global source lines, global bit lines are applied to 0V and array's TPW is applied to 0V as well. There will be no voltage difference between array's TPW & cell's N+ source/drain. As to the BLG [0], BLG [1], SLG [0] & SLG [1], they are all tied to 0V to turn off MB0, MB1, MS0 & MS1. All the word lines in this selected sector are applied to 17V~20V. Therefore, all the cells along all the word lines coupled to LBL [0]-LBL [k−1] will be erased by the channel Fowler-Nordheim tunneling. In other words, the strong electrical field between array's TPW and all the word lines will pull out the electrons from the array's TPW through the tunnel insulating layer toward the floating gate. It ends up with to increase the threshold voltage by this channel Fowler-Nordheim tunneling. However, it will end up with a broadened Vt distribution in the erases state because of the large amount memory cells with different characteristics such as the fast or slow ones.

Figure 7F:
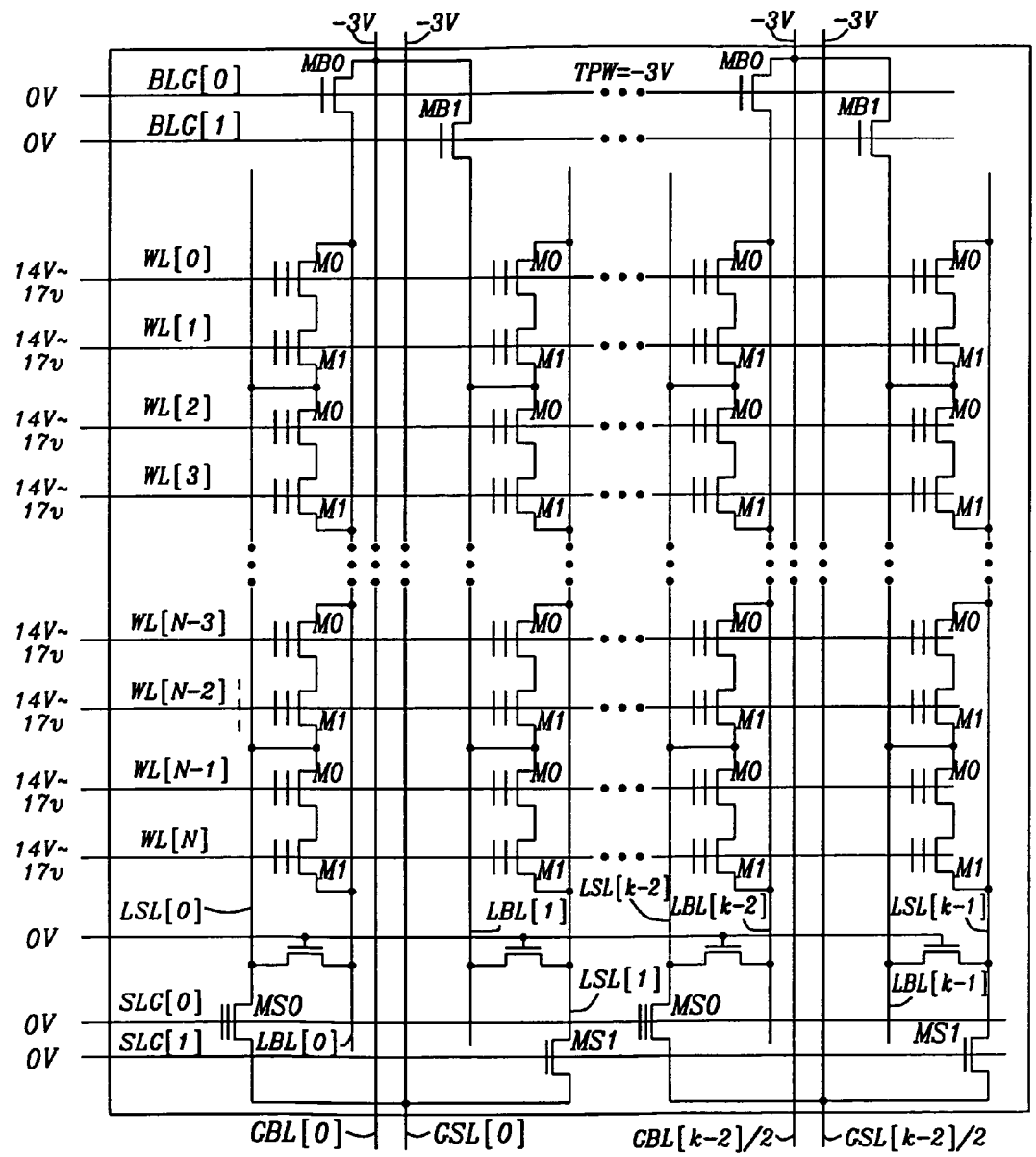
FIG. 7f is a sector erase bias condition with TPW=-3V in 1 sector of N-channel 2T-string NOR flash array of embodiment 1.

FIG. 7f shows the biased voltages with TPW=−3V on a preferred one sector of N-channel 2T-string NOR Flash array during the sector erase operation of embodiment 1. The channel Fowler-Nordheim tunneling occurs in this sector erase operation. All the global source lines, global bit lines are applied to −3V and array's TPW is applied to −3V as well. There will be no voltage difference between array's TPW & cell's N+ source/drain. As to the BLG [0], BLG [1], SLG [0] & SLG [1], they are all tied to 0V to turn on MB0, MB1, MS0 & MS1. All the word lines in this selected sector are applied to 14V~17V. Therefore, all the cells along all the word lines coupled to LBL [0]-LBL [k−1] will be erased by the channel Fowler-Nordheim tunneling. In other words, the strong electrical field between array's TPW and all the word lines will pull out the electrons from the array's TPW through the tunnel insulating layer toward the floating gate. It ends up with to increase the threshold voltage by this channel Fowler-Nordheim tunneling. However, it will end up with a broadened Vt distribution in the erases state because of the large amount memory cells with different characteristics such as the fast or slow ones.

Figure 7G:
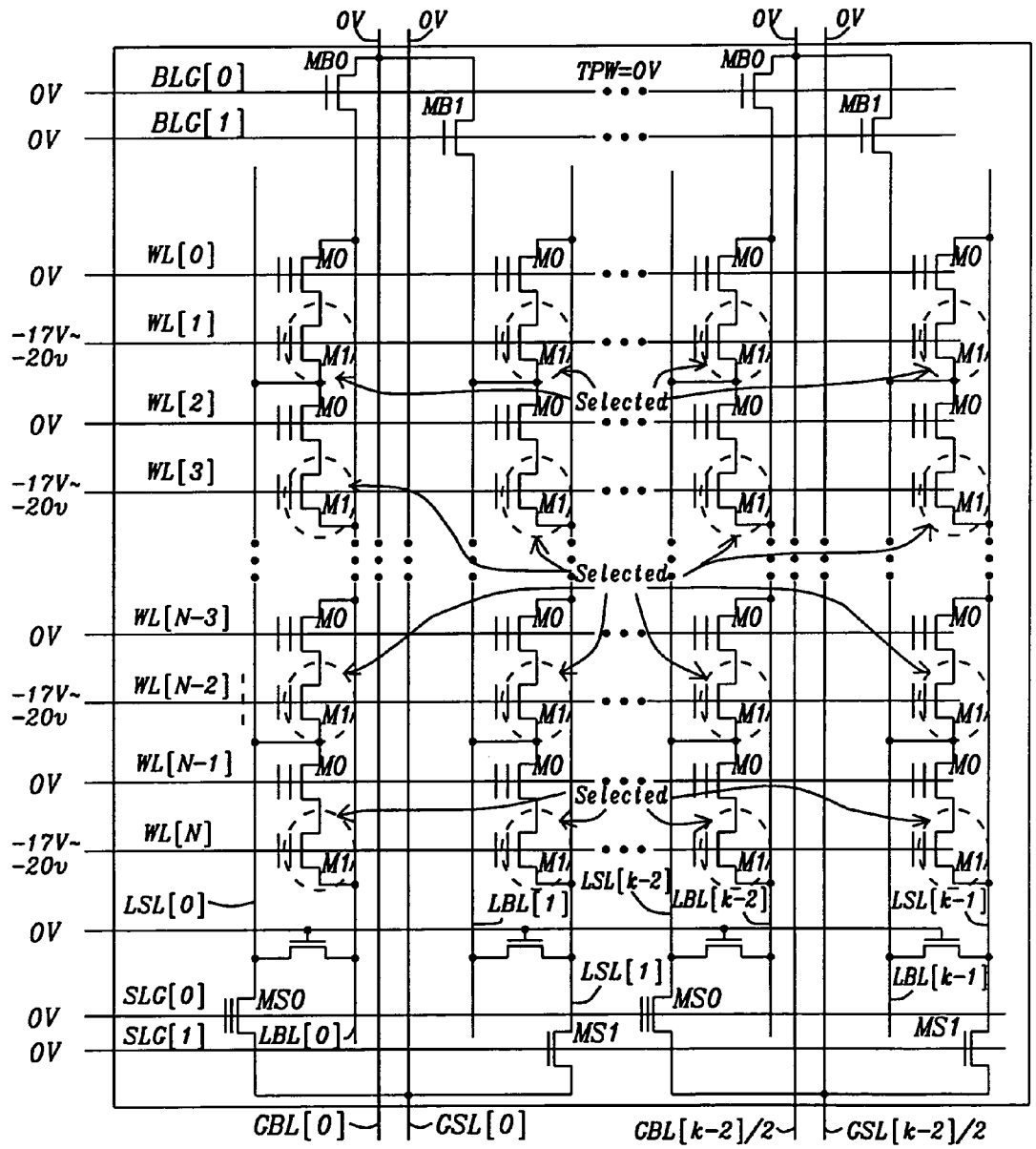
FIG. 7g is a lower-WL sector erase bias condition with TPW=0V in 1 sector of N-channel 2T-string NOR flash array of embodiment 2.

FIG. 7g shows the biased voltages with TPW=0V on a preferred one sector of N-channel 2T-string NOR Flash array during the lower-WL sector erase operation of embodiment 2. The channel Fowler-Nordheim tunneling occurs in this lower-WL sector erase operation. All the global source lines, global bit lines are applied to 0V and array's TPW is applied to 0V as well. There will be no voltage difference between array's TPW & cell's N+ source/drain. As to the BLG [0], BLG [1], SLG [0] & SLG [1], they are all tied to 0V to turn off MB0, MB1, MS0 & MS1. The selected lower WL [1], WL [3], WL [N−2] & WL [N] are applied to −17V~−20V. All the other unselected word lines are applied to 0V. Therefore, M1 cells along lower WL [1], WL [3], WL [N−2] & WL [N] coupled to LBL [0]-LBL [k−1] will be erased by the channel Fowler-Nordheim tunneling. In other words, the strong electrical field between array's TPW and lower WL [1], WL [3], WL [N−2] & WL [N] will pull out the electrons from the floating gate through the tunnel insulating layer toward the array's TPW. It ends up with to decrease the threshold voltage by this channel Fowler-Nordheim tunneling. As for the other unselected word lines WL [0], WL [2], ... WL [N−3] & WL [N−1] do not have any stress because of 0V difference between word line and TPW. However, it will end up with a broadened Vt distribution in the erases state because of the large amount memory cells with different characteristics such as the fast or slow ones.

Figure 7H:
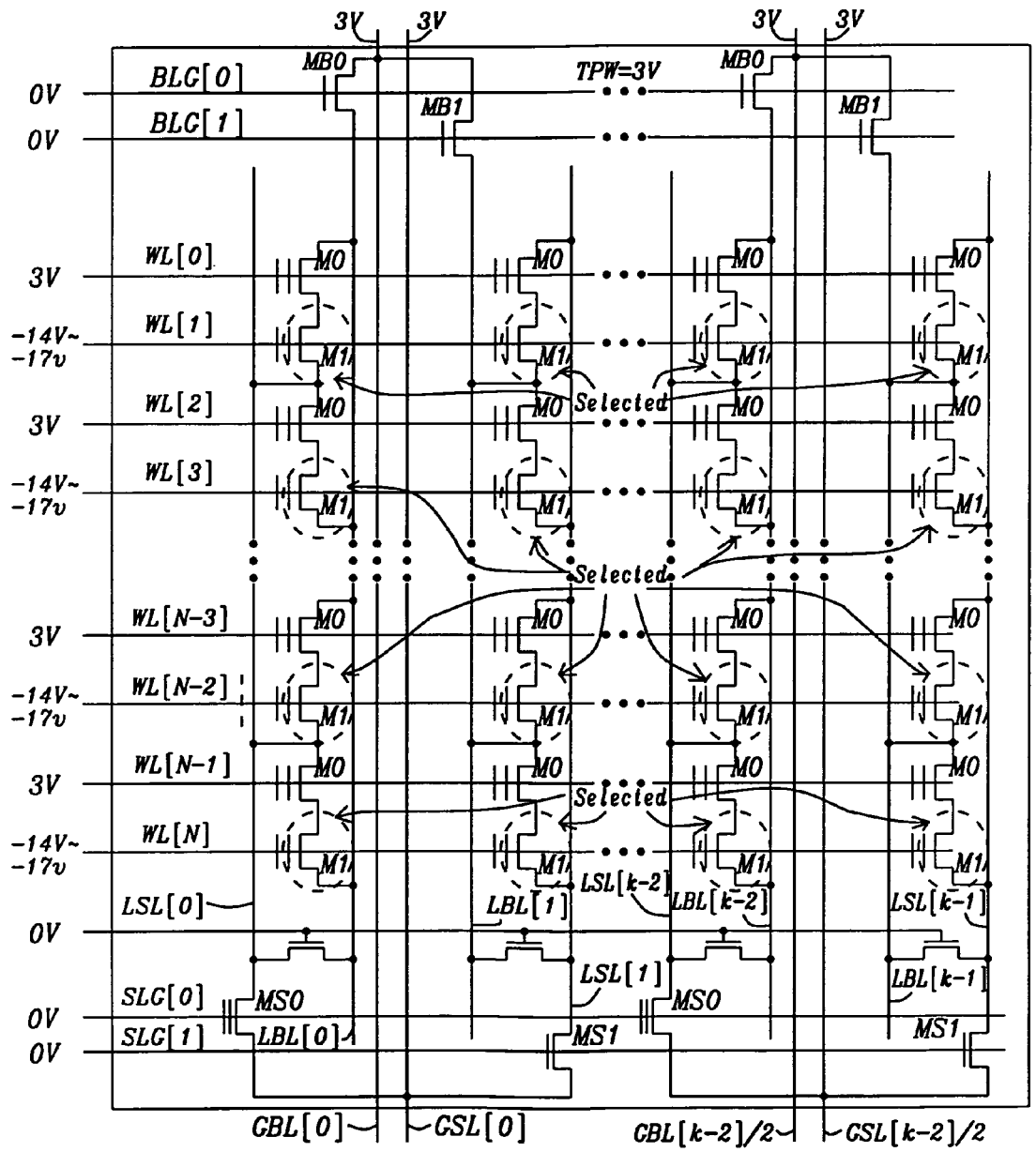
FIG. 7h is a lower-WL sector erase bias condition with TPW=3V in 1 sector of N-channel 2T-string NOR flash array of embodiment 2.

FIG. 7h shows the biased voltages with TPW=3V on a preferred one sector of N-channel 2T-string NOR Flash array during the lower-WL sector erase operation of embodiment 2. The channel Fowler-Nordheim tunneling occurs in this lower-WL sector erase operation. All the global source lines, global bit lines are applied to 3V and array's TPW is applied to 3V as well. There will be no voltage difference between array's TPW & cell's N+ source/drain. As to the BLG [0], BLG [1], SLG [0] & SLG [1], they are all tied to 0V to turn off MB0, MB1, MS0 & MS1. The selected lower WL [1], WL [3], WL [N−2] & WL [N] are applied to −14V~−17V. All the other unselected word lines are applied to 3V. Therefore, M1 cells along WL [3] coupled to LBL [0]-LBL [k−1] will be erased by the channel Fowler-Nordheim tunneling. In other words, the strong electrical field between array's TPW and lower WL [1], WL [3], WL [N−2] & WL [N] will pull out the electrons from the floating gate through the tunnel insulating layer toward the array's TPW. It ends up with to decrease the threshold voltage by this channel Fowler-Nordheim tunneling. However, it will end up with a broadened Vt distribution in the erases state because of the large amount memory cells with different characteristics such as the fast or slow ones.

Figure 8A:
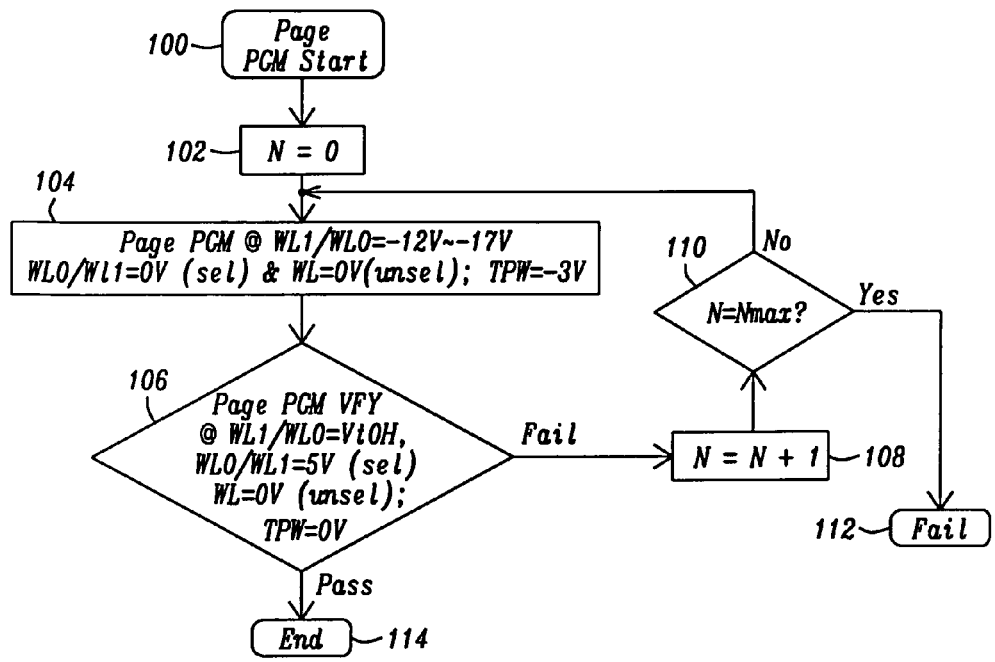
FIG. 8a is a flow chart of page program operation for N-channel 2T-string NOR flash of embodiment 1.

FIG. 8a shows the flow chart of page program operation 100 for N-channel 2T-string NOR Flash of the present invention of embodiment 1. In 102, the page program operation count N is set to 0. The following step 104 is used to perform the page program operation. It can be achieved by edge F-N tunneling. The selected WLs are applied to −12~−17V and the unselected WLs are applied to 0V. TPW is applied to −3V. Once the page program operation in 104 is completed within a predetermined program time, the page program verify operation 106 will be followed by applying Vt0H to the selected WLs and 5V to the adjacent WLs of the selected paired WLs. TPW is charged back to 0V. This verification is to determine whether the Vt of storage transistors with program data of the selected WL is lower than Vt0H or not? It passes if the Vt of storage transistors with program data of the selected WL is lower than Vt0H. If it passes, it means the successful page program operation is obtained in 106. If it fails, the page program operation count N will be incremented by 1 in 108. The next step 110 is used to determine whether page program operation count N exceeds the max allowed number or not? If it is true, the device is treated as bad die in 112. Otherwise, the page program operation will be continued in 104.

Figure 8B:
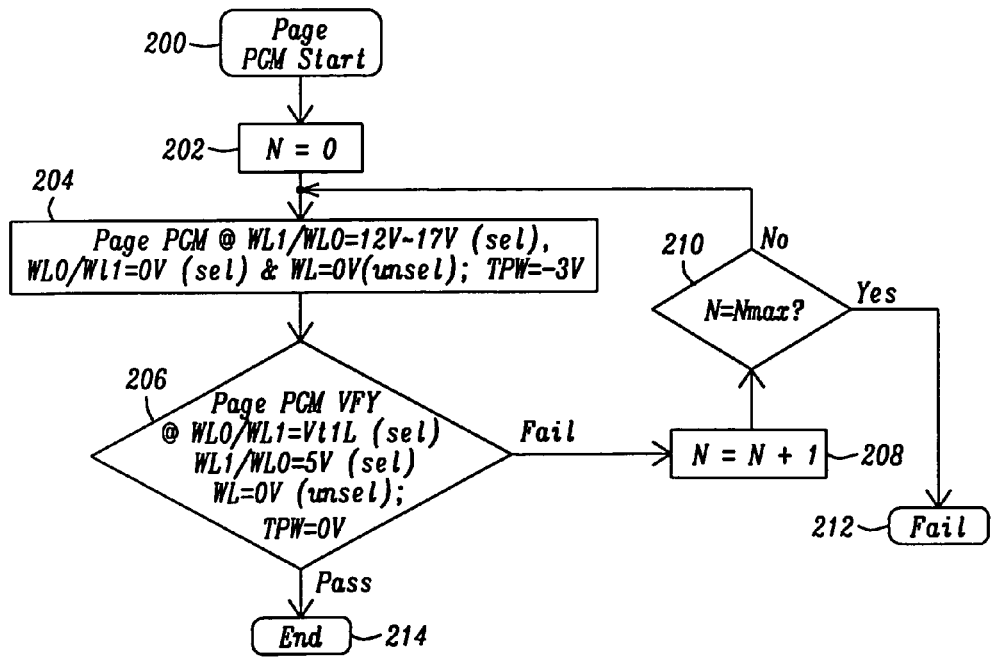
FIG. 8b is a flow chart of page program operation for N-channel 2T-string NOR flash of embodiment 2.

FIG. 8b shows the flow chart of page program operation 200 for N-channel 2T-string NOR Flash of the present invention of embodiment 2. In 202, the page program operation count N is set to 0. The following step 204 is used to perform the page program operation. It can be achieved by channel F-N tunneling. The selected WL is applied to 12~17V and the unselected WLs are applied to 0V. TPW is applied to −3V. Once the page program operation in 204 is completed within a predetermined program time, the page program verify operation 206 will be followed by applying Vt1L to the selected WL and 5V to the adjacent WL of the selected paired WL. TPW is charged back to 0V. This verification is to determine whether the Vt of storage transistors with program data of the selected WL is larger than Vt1L or not? It passes if the Vt of storage transistors with program data of the selected WL is larger than Vt1L. If it passes, it means the successful page program operation is obtained in 206. If it fails, the page program operation count N will be incremented by 1 in 208. The next step 210 is used to determine whether page program operation count N exceeds the max allowed number or not? If it is true, the device is treated as bad die in 212. Otherwise, the page program operation will be continued in 204.

Figure 9D:
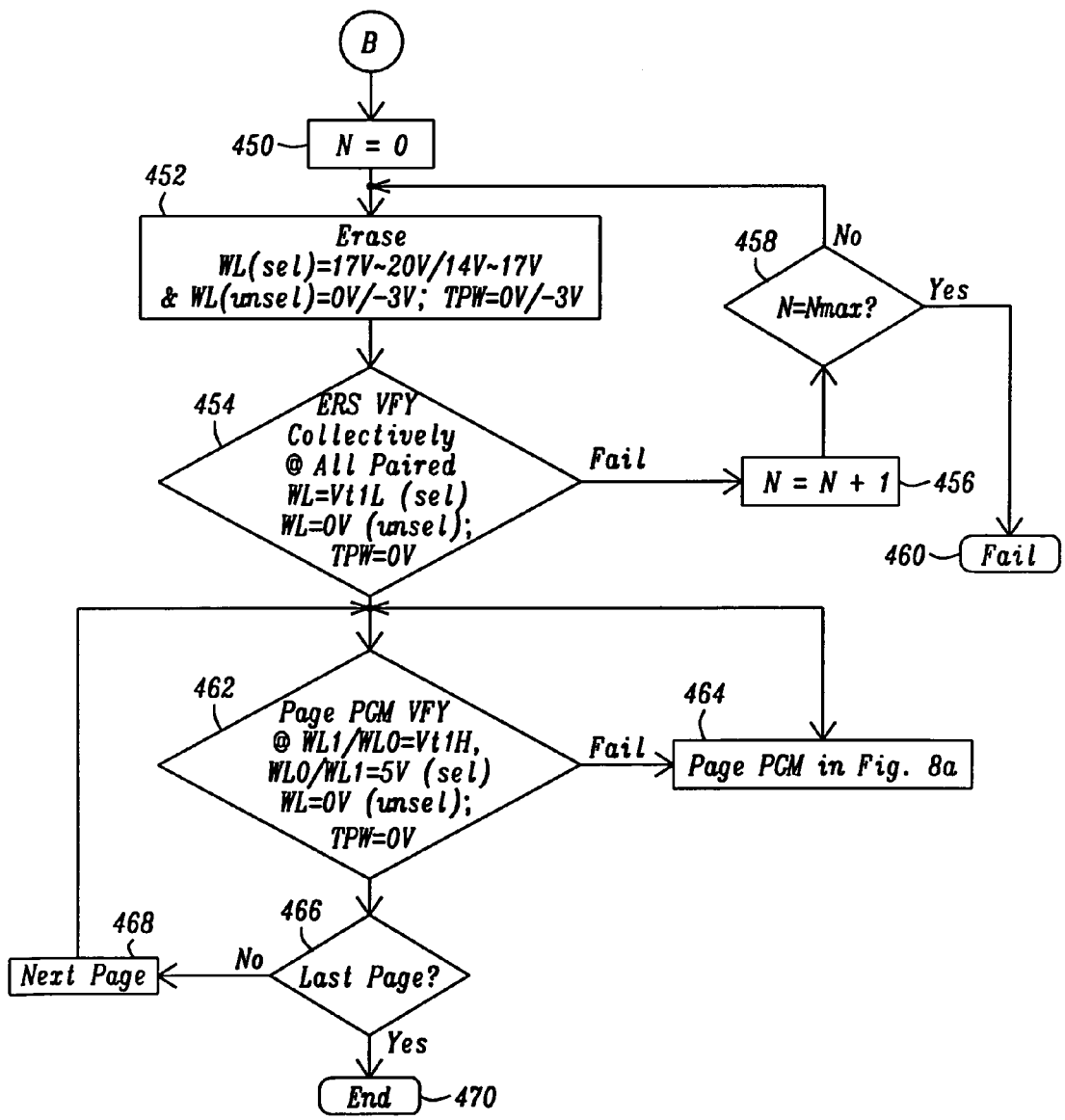
FIG. 9d is a flow chart of block/sector/chip erase operation for N-channel 2T-string NOR flash of embodiment 1.

FIG. 9a and FIG. 9b are the flow charts for the method for operating the N-channel 2T-string NOR Flash of the present invention of embodiment 1 & 2. There are 4 kinds of erase operations. They are page erase, block erase, sector erase, and chip erase. One block comprises several pages, e.g. 16 pages. One sector comprises several blocks, e.g. 32 blocks. In a same manner, one chip may comprise several sectors, e.g. 64 sectors. Once receiving the erase command from the system, the corresponding operation will be preceded as the following flow chart in FIG. 9c-FIG. 9g. For the embodiment 1, subroutine A is used for page erase and subroutine B is used for block erase, sector erase and chip erase. For the embodiment 2, subroutine C is used for page erase and subroutine D is used for block erase, sector erase and chip erase.

FIG. 9c shows the flow chart of page erase operation in subroutine A for N-channel 2T-string NOR Flash of the present invention of embodiment 1. In 402, the page erase operation count N is set to 0. The following step 404 is used to perform page erase operation. It can be achieved by channel F-N tunneling. The selected WL is applied to 17V~20V/14V~17V and the unselected WLs are applied to 0/−3V. TPW is applied to 0V/−3V. Once the page erase operation in 404 is completed within a predetermined erase time, the page erase verify operation 406 will be followed by applying Vt1L to the selected WL and 5V to the adjacent WL of the selected paired WL. TPW is charged back to 0V. This verification is to determine whether all the Vt of storage transistors of the selected page are larger than Vt1L or not? ? It passes if the Vt of storage transistors with program data of the selected WL is larger than Vt1L. If it passes, it means the threshold voltage of the selected page is above Vt1L. If it fails, the page erase operation count N will be incremented by 1 in 408. The next step 410 is used to determine whether page erase operation count N exceeds the max allowed number or not? If it is true, the device is treated as bad die in 412. Otherwise, the page erase operation will be continued in 404. Since this erase verification is used to check the lower bound of the Vt1, there is a need of checking procedure for the upper bound of Vt1 to guarantee the tightened Vt1 distribution. Therefore, 414 is used to check Vt1H by applying Vt1H to the selected WL and 5V to the adjacent WL of the selected paired WL once the successful erase verification is obtained in 406. It passes if the Vt of storage transistors with program data of the selected WL is smaller than Vt1H.

If it passes again, it means the successful page erase operation is obtained and finishes the subroutine A in 418. If it fails, the bit-by-bit page program operation will be preceded in 416, which is same as the procedure in the page program flow chart in FIG. 8a. All the cells of this selected page with Vt1L<=Vt<=Vt1H will be issued the program inhibit data pattern and any cell's Vt>Vt1H will be issued the program data pattern for a further program operation. This program operation assures the tightened Vt distribution for the $2^{nd}$ program state in the page erase operation.

FIG. 9d shows the flow chart of block/sector/chip erase operation in subroutine B for N-channel 2T-string NOR Flash of the present invention of embodiment 1. In 450, the block/sector/chip erase operation count N is set to 0. The following step 452 is used to perform block/sector/chip erase operation. It can be achieved by channel F-N tunneling. The selected WL is applied to 17V~20V/14V~17V and the unselected WLs are applied to 0V/-3V. TPW is applied to 0V/-3V. Of course, in the chip erase case, all the WL will be applied to 17V~20V/14V~17V. Once the block/sector/chip erase operation in 452 is completed within a predetermined erase time, the block/sector/chip erase verify operation 454 will be followed by applying Vt1L to all the selected WL. TPW is charged back to 0V. This verification is to determine whether all the Vt of storage transistors of the selected page is larger than Vt1L or not? It passes if the Vt of storage transistors with program data of the selected WL is larger than Vt1L. If it passes, it means the threshold voltage of the selected block/sector/chip is above Vt1L. If it fails, the block/sector/chip erase operation count N will be incremented by 1 in 408. The next step 458 is used to determine whether block/sector/chip erase operation count N exceeds the max allowed number or not? If it is true, the device is treated as bad die in 460. Otherwise, the block/sector/chip erase operation will be continued in 452. Since this erase verification is used to check the lower bound of the Vt1, there is a need of checking procedure for the upper bound of Vt1 to guarantee the tightened Vt1 distribution. Therefore, 462 is used to check Vt1H by applying Vt1H to the selected WL and 5V to the adjacent WL of the selected paired WL once the successful erase verification is obtained in 454. If it passes in 462, it means the threshold voltage of the current page is fallen within the range of >=Vt1L and <=Vt1H and the step 466 will ask whether it is the last page. If yes, it finishes the subroutine B in 470. If not, the page will be incremented in 468. Back to step 462, if any cell's Vt of the current page is higher than Vt1H, the bit-by-bit page program operation will be preceded in 464, which is same as the procedure in the page program flow chart in FIG. 8a. All the cells of this selected page with Vt1L<=Vt<=Vt1H will be issued the program inhibit data pattern and any cell's Vt>Vt1H will be issued the program data pattern for a further program operation. This bit-by-bit page program operation assures the tightened Vt distribution for the $2^{nd}$ program state in the block/sector/chip erase operation as well.

Figure 9E:
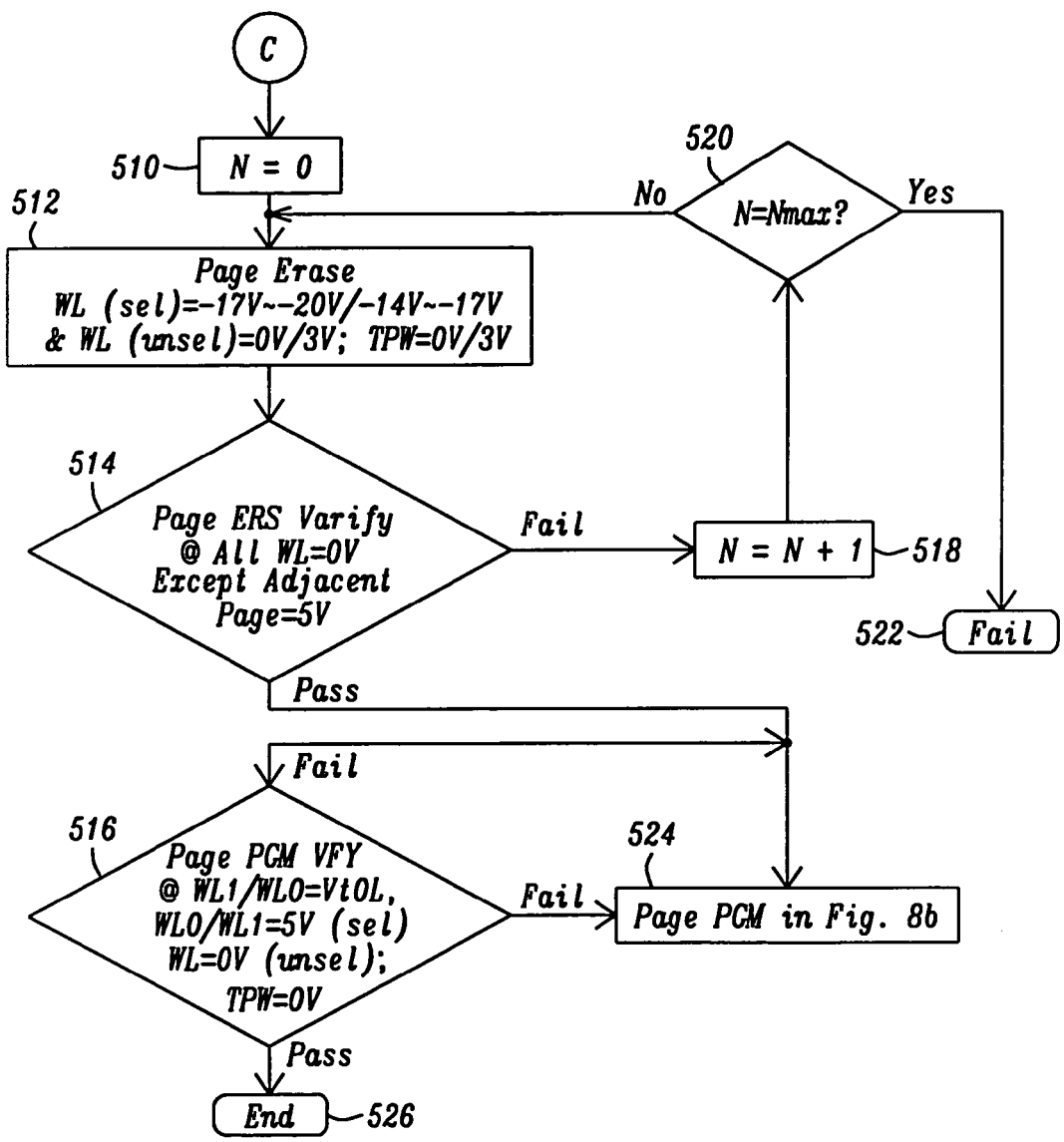
FIG. 9e is a flow chart of page erase operation for N-channel 2T-string NOR flash of embodiment 2.

FIG. 9e shows the flow chart of page erase operation in subroutine C for N-channel 2T-string NOR Flash of the present invention of embodiment 2. In 510, the page erase operation count N is set to 0. The following step 512 is used to perform page erase operation. It can be achieved by channel F-N tunneling. The selected WL is applied to -17V~-20V/-14V~-17V and the unselected WLs are applied to 0V/3V. TPW is applied to 0V/3V. Once the page erase operation in 512 is completed within a predetermined erase time, the page erase verify operation 514 will be followed by applying 0V to the selected WL and 5V to the adjacent WL of the selected paired WL. TPW is charged back to 0V. This verification is to determine whether all the Vt of storage transistors of the selected page are less than ~-1V or not? It passes if the Vt of storage transistors with program data of the selected WL is less than -1V. It can be done by issuing all the LSL to 1V and all the LBL is pre-discharged to 0V. If it passes, it means the threshold voltage of the selected page is lower than ~-1V. Therefore, the LBL will be charged to 1V from LSL. Otherwise, it fails without having the charge from LSL and the page erase operation count N will be incremented by 1 in 518. The next step 520 is used to determine whether page erase operation count N exceeds the max allowed number or not? If it is true, the device is treated as bad die in 522. Otherwise, the page erase operation will be continued in 512. Since this erase operation is used to decrease the threshold voltage far lower than the distribution of the $1^{st}$ program state, there is a need of bit-by-bit page program operation 524 to bring them back within the $1^{st}$ program state, i.e., Vt0L<=Vt<=Vt0H. It is same as the procedure in the page program flow chart in FIG. 8b. After a predetermined program time, the program verification will be preceded in step 516 by applying Vt0L to the selected WL and 5V to the adjacent WL of the selected paired WL. TPW is charged back to 0V. All the cells of this selected page with Vt>=Vt0L will be issued the program inhibit data pattern and any cell's Vt<Vt0L will be issued the program data pattern for a further program operation in 524 again. If all the cell's Vt of the current page is higher than Vt0L, it finishes the subroutine C in 524.

According to the negative Vt distribution before the bit-by-bit page program in this erase operation; it can be treated as the over-erase operation as well. This bit-by-bit page program operation assures the tightened Vt distribution for the $1^{st}$ program state in the page erase operation.

Figure 9F:
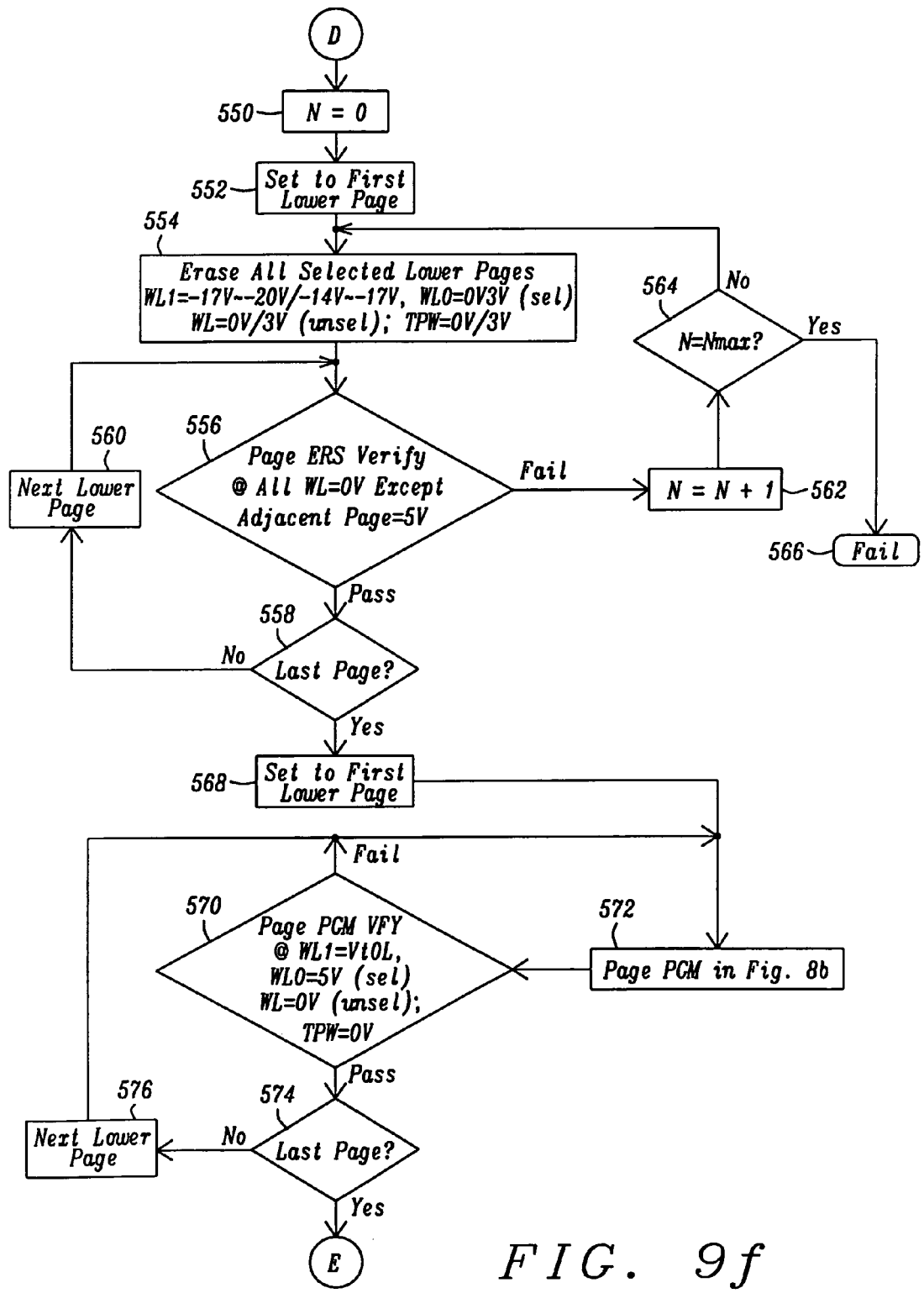
FIG. 9f is a flow chart of lower-WL block/sector/chip erase operation for N-channel 2T-string NOR flash of embodiment 2.

FIG. 9f shows the flow chart of lower-WL block/sector/chip erase operation in subroutine D for N-channel 2T-string NOR Flash of the present invention of embodiment 2. In 550, the lower-WL block/sector/chip erase operation count N is set to 0. The following step 552 is to set to the first lower WL page. Step 554 is used to perform lower-WL block/sector/chip erase operation for all selected lower pages. It can be achieved by channel F-N tunneling. The selected lower word lines WL1 are applied to -17V~-20V/-14V~-17V, the selected upper word lines WL0 are applied to 0V/3V, and the unselected WLs are applied to 0V/3V, wherein in the case of chip erase all word lines will be applied to a voltage in the range of about -17V~-20V/-14V~-17V. TPW is applied to 0V/3V. Once the lower-WL block/sector/chip erase operation in 554 is completed within a predetermined erase time, the page erase verify operation 556 will be followed by applying 0V to the selected WL and 5V to the adjacent WL of the selected paired WL.

The selected paired WL is actually shown in FIG. 1.a. Each paired WL is composed of the upper WL (WL0) & Lower WL (WL1). Once performing the page erase verification in the case of lower WLs, the adjacent upper WL0 of the selected paired WL will be applied to 5V because its Vt may stay at Vt0 or Vt1. All the other unselected paired WL will be applied to 0V.

TPW is charged back to 0V. This verification is to determine whether all the Vt of storage transistors of the selected page are less than ~-1V or not? It can be done by issuing all the LSL to 1V and all the LBL is pre-discharged to 0V. It passes if the Vt of storage transistors with program data of the selected WL is less than -1V. If it passes, it means the threshold voltage of the selected page is lower than ~-1V. Therefore, the LBL will be charged to 1V from LSL. Otherwise, it fails without having the charge from LSL and the lower-WL block/sector/chip erase operation count N will be incremented by 1 in 562. The next step 564 is used to determine whether lower-WL block/sector/chip erase operation count N exceeds the max allowed number or not? If it is true, the device is treated as bad die in 566. Otherwise, the lower-WL block/sector/chip erase operation will be continued in 554. Back to step 556, the determination step in 558 will be asked after successful page erase verification. If it is not the last page in lower-WL block/sector/chip, the next lower page will be accessed in 560. Once it reaches to the last page, it will reset the very first lower page again in step 568. Since this erase operation is used to decrease the threshold voltage far lower than the distribution of the $1^{st}$ program state, there is a need of bit-by-bit page program operation 572 to bring them back within the $1^{st}$ program state, i.e., Vt0L<=Vt<=Vt0H. It is same as the procedure in the page program flow chart in FIG. 8b. After a predetermined program time, the program verification will be preceded in step 570 by applying Vt0L to the selected WL1 of the lower selected page, 5V to the adjacent WL0 of the selected WL, and 0V to the unselected WL.

TPW is charged back to 0V. All the cells of this selected page with Vt>=Vt0L will be issued the program inhibit data pattern and any cell's Vt<Vt0L will be issued the program data pattern for a further program operation in 572 again. If the entire cell's Vt of the current page is higher than Vt0L, it will go the next step 574 to determine whether it is the last lower-WL page of block/sector/chip or not? If yes, it finishes the subroutine D and will go to another subroutine E in FIG. 9g. If not, the next lower-WL page in 576 will be accessed. According to the negative Vt distribution before the bit-by-bit page program in this erase operation; it can be treated as the over-erase operation as well. This bit-by-bit page program operation assures the tightened Vt distribution for the $1^{st}$ program state in the lower-WL block/sector/chip erase operation.

Figure 9G:
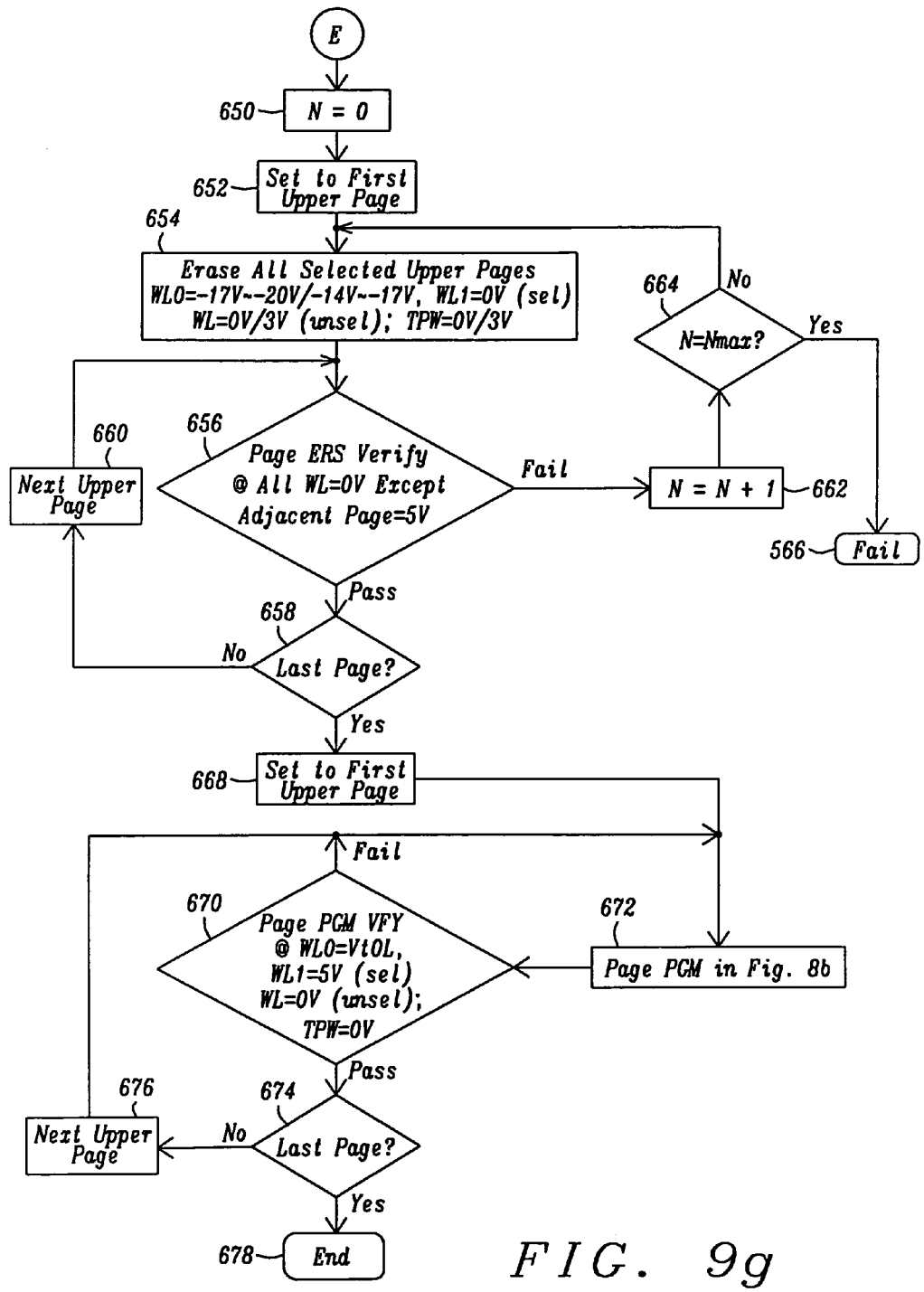
FIG. 9g is a flow chart of upper-WL block/sector/chip erase operation for N-channel 2T-string NOR flash of embodiment 2.

FIG. 9g shows the flow chart of upper-WL block/sector/chip erase operation in subroutine E for N-channel 2T-string NOR Flash of the present invention of embodiment 2. It is totally same as the subroutine in D except the different page. Owing to this 2T-string NOR Flash structure, it provides a reliable and fast erase scheme without malfunction in verification after the over-erase operation scheme. In other words, it allows the flash cell's Vt to be a negative value without causing failed verification by two steps of lower-WL block/sector/chip erase and upper-WL block/sector/chip erase alternatively.

FIG. 10 is a table of the read operation for N-channel 2T-string NOR flash of all the embodiments. The selected paired WL voltages are 5V & 2.7V (VDD=2.7V-3.6V or VDD=1.7V-1.9V). The former one will be issued as the pass voltage to turn on the cells even though they may have the maximum threshold voltage (i.e. 3.15V). The latter one will be issued to the selected WL voltage and is used to distinguish the $1^{st}$ program state or the $2^{nd}$ program state. The Local bit line LBL is applied to 1V. It will be wired to the sense amplifier by turning on the corresponding pass transistors with VDD to selected BLG & SLG and turning off the pass transistors with 0V to unselected BLG & SLG. The $2^{nd}$ program state indicated the higher threshold voltage and it will flow no or less cell current once VR=2.7V WL voltage is applied to selected cell. It ends up with more positive charge on GBL [0] with 1V+δV1. On the contrary, if selected cell is the $1^{st}$ program state, it indicates the lower threshold voltage. There will be larger flowing current. It ends up with less positive charge on GBL [0] with 1V-δV2. Owing to the small voltage difference, the next stage of sense amplifier can distinguish which state belongs.

FIG. 11a is a table of the page program operation for N-channel 2T-string NOR flash of the embodiment 1. The corresponding biased voltage has been shown in FIG. 5

FIG. 11b is a table of the page program operation for N-channel 2T-string NOR flash of the embodiment 2. The corresponding biased voltage has been shown in FIG. 6

FIG. 12a is a table of the erase operation for N-channel 2T-string NOR flash of the embodiment 1. The corresponding biased voltage has been shown in FIGS. 7a, 7b, 7e & 7f.

FIG. 12b is a table of the erase operation for N-channel 2T-string NOR flash of the embodiment 2. The corresponding biased voltage has been shown in FIGS. 7c, 7d, 7g & 7h.

While the invention has been particularly shown and described with reference to the preferred embodiments thereof, it will be understood by those skilled in the art that various changes in form and details may be made without departing from the spirit and scope of the invention.

While the invention has been particularly shown and described with reference to the preferred embodiments thereof, it will be understood by those skilled in the art that various changes in form and details may be made without departing from the spirit and scope of the invention.

What is claimed is:

1. A random-read NOR flash memory array comprising one or more memory sectors, each sector comprising
   N+1 word lines;
   K local sub-bit lines, which are perpendicular to the word-lines;
   K local sub-source lines, which are perpendicular to the word-lines;
   (K+1)/2 global bit lines, wherein every two sub-bit lines are decoded to form one of said global bit lines;
   (K+1)/2 global source lines, wherein every two sub-source lines are decoded to form one of said global source lines; and
   (N+1)/2×K flash memory cells, wherein each flash memory cell is a NAND-based N-channel 2T-string NOR flash memory cell device storing two bits, and wherein said cells can be coupled with appropriate bias condition in circuit for respective operation, comprising:
      a first and a second storage NMOS transistor in series without common source line;
      a drain/source node, which is connected to a corresponding local sub-bit line, wherein the local sub-bit line and a local sub-source line are perpendicular to word lines;
      a source/drain node, which is connected to the corresponding local sub-source line;
      a first word line terminal, which is connected to a word line corresponding to the first transistor;
      a second word line terminal, which is connected to a word line corresponding to the second transistor;
      two gates of said two transistors, each transistor comprising a gate dielectric layer underneath of each of said gates, a floating gate underneath of each said dielectric layer, and a tunnelling oxide layer underneath of each of floating gates;
      a common triple P-well region underneath said tunnelling oxide layers comprising a N+ drain/source region connected to said drain/source node, and a N+ source/drain region connected to said source/drain node;
      a deep N-well region underneath the triple P-well region; and
      an active P-SUB region underneath the deep N-well region.

2. The flash memory array of claim 1 wherein said both storage transistors are made of 2-poly cells.

3. The flash memory array of claim 1 wherein both said local sub-bit line and said local sub-source line are metal lines.

4. The flash memory array of claim 1 wherein said gate dielectric layer comprises oxide-nitride-oxide (ONO).

5. The flash memory array of claim 1 wherein electrons injected from the triple P-well region can be retained in the floating gates while programming is performed.

6. The flash memory array of claim 5 wherein stored electrons in the floating gates could be pulled out toward the triple P-well region while erasing is performed.

7. The flash memory array of claim 1 wherein electrons injected from the triple P-well region can be retained in the floating gates while erasing is performed.

8. The flash memory array of claim 7 wherein stored electrons in the floating gates could be pulled out toward the drain/source region while programming is performed.

9. The flash memory array of claim 7 wherein stored electrons in the floating gates could be pulled out toward the source/drain region while programming is performed.

10. The flash memory array of claim 1 wherein a threshold voltage Vt of the storage transistors can be bit-by-bit programmed to a tightened distribution.

11. The flash memory array of claim 10 wherein the threshold voltage Vt can be set to two program states.

12. The flash memory array of claim 11 wherein a first state of the threshold voltage is set with a preferred center value of about 1 V and a second state of the threshold voltage is set with a preferred center value of about 3 V.

13. The flash memory array of claim 1 wherein the memory cell is operating within a range of +/−20 V biased voltages.

14. The flash memory array of claim 13 wherein breakdown voltages of desired peripheral devices are tuned to be about 20V accordingly with the High-voltage NMOS devices are formed within the triple P-well region in the deep N-well region on the P-substrate.

15. The flash memory array of claim 13 wherein voltages of about +/−3V are applied to respective nodes of the sources, drains and bulks of selected cells that are connected to selected multiple bit lines along with the +/−20V biased voltages coupled to the cells' gates that are connected to one selected word line for realizing reliable program and program inhibit operations.

16. The flash memory array of claim 1 wherein edge Fowler-Nordheim tunneling scheme is used for performing program operation in junction with channel Fowler-Nordheim scheme for erase operation.

17. The flash memory array of claim 1 wherein low-current channel Fowler-Nordheim tunneling scheme is used for performing both program and erase operations.

18. The flash memory array of claim 1 wherein an over-erase free scheme is being achieved, in which it can prevent the malfunction from happening during the cycle of erase verifying.

19. The flash memory array of claim 1 wherein program scheme is provided that keeps zero voltage drop between respective drain node and the source node of selected cells to prevent channel punch-through from happening.

* * * * *